(12) United States Patent
Yasunami et al.

(10) Patent No.: US 7,090,960 B2
(45) Date of Patent: Aug. 15, 2006

(54) NEGATIVE RESIST COMPOSITION

(75) Inventors: Shoichiro Yasunami, Shizuoka (JP); Kunihiko Kodama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 380 days.

(21) Appl. No.: 10/330,332

(22) Filed: Dec. 30, 2002

(65) Prior Publication Data

US 2003/0165776 A1 Sep. 4, 2003

(30) Foreign Application Priority Data

Jan. 11, 2002 (JP) .................... P. 2002-004658
Apr. 18, 2002 (JP) .................... P. 2002-116216

(51) Int. Cl.
*G03F 7/038* (2006.01)
(52) U.S. Cl. .................................. 430/270.1
(58) Field of Classification Search ............. 430/296, 430/270.1, 280.1
See application file for complete search history.

(56) References Cited

U.S. PATENT DOCUMENTS 5,296,332 A * 3/1994 Sachdev et al. ......... 430/280.1
6,031,014 A   2/2000 Crivello
6,074,800 A * 6/2000 Breyta et al. ............ 430/270.1
6,329,119 B1 * 12/2001 Suetsugu et al. ......... 430/270.1
6,528,232 B1 * 3/2003 Maeda et al. ............ 430/270.1
2003/0124456 A1* 7/2003 Shirakawa et al. ....... 430/270.1

FOREIGN PATENT DOCUMENTS

DE       10054550 A1 *  5/2001
JP     2000-292917 A  * 10/2000
JP     2001-294570 A    10/2001

OTHER PUBLICATIONS

Derwent-Acc-No. 2001-484005, Derwent-Week 200462, Hasegawa et al, JP 3567984 B2, 3 pages, Derwent Information LTD, copyrign 2005.*
Ferreira et al, "Choice of Amines as Stabilizers for Chemically Amplified Resist Systems", SPIE vol. 333, pp. 236-244, Jun. 1998 editor : Will Conley. Advances in Resist Technology and Processing XV.*

* cited by examiner

*Primary Examiner*—Cynthia Hamilton
(74) *Attorney, Agent, or Firm*—Sughrue Mion, PLLC

(57) ABSTRACT

A negative resist composition comprising (A) an alkali-soluble polymer, (B) a cross-linking agent forming cross-links between molecules of the alkali-soluble polymer (A) under the action of an acid and (C) a specified acid generator, which can satisfy all of performance requirements concerning sensitivity, resolution, pattern profile and line-edge roughness in the pattern formation by irradiation with electron beams or X-rays.

16 Claims, No Drawings

NEGATIVE RESIST COMPOSITION

FIELD OF THE INVENTION

The present invention relates to a negative resist composition used suitably in supermicrolithography and other fabrication processes for production of VLSIs and high-capacity microchips. More specifically, the invention is concerned with a negative resist composition capable of forming highly resolved patterns by using electron beams or X-rays in particular.

BACKGROUND OF THE INVENTION

In processes of producing semiconductor devices, such as ICs and LSIs, fine patterning has so far been performed by photoresist composition-utilized lithography. With recent increase in packing densities of chips, there has been a growing demand for formation of superfine patterns having their widths in the region of submicrons or quatermicrons. In line with such a demand, there has been a trend toward exposure light of shorter wavelengths, namely a trend to change exposure light from g-ray to i-ray and further to KrF excimer laser light. At present, development of not only the lithography using excimer lasers but also electron-beam lithography and X-ray lithography is progressing.

In particular, the electron-beam lithography is placed as pattern-formation technology of next generation or the generation after next, and high-sensitivity, high-resolution negative resists are required therefor. Increasing the sensitivity is a very important problem, notably in reducing a wafer processing time. As to negative resists for use in electron-beam lithography, however, the pursuit of increases in their sensitivities gives rise to aggravation of line edge roughness in addition to a drop in resolution and a deterioration of pattern profiles. Therefore, it is strongly desired to develop resists meeting those characteristic requirements all together. The term "line edge roughness" as used herein means that edges are seen rough when patterns are viewed from the direction right above them because irregular undulation in the direction perpendicular to the line direction is caused in the edges of the resist pattern-substrate interface by characteristics of the resist. Transfer of this roughness occurs in the etching process using the resist as a mask, and results in deterioration of electric characteristics and lowering of yields. Particularly in the superfine region of 0.25 μm or below, an improvement in the line edge roughness is a vitally important problem. As the high sensitivity is in tradeoffs with high resolution, good pattern profiles and favorable line edge roughness, it is of great importance how to achieve satisfactory levels of improvement in all of those properties.

As resists suitable for the electron-beam lithography and the X-ray lithography, chemical-amplification resists principally utilizing acid-catalyzed reaction have been employed from the viewpoint of increasing the sensitivity. With respect to negative resists, chemical-amplification compositions containing as main components alkali-soluble resins, cross-linking agents and acid generators have been effectively used.

Hitherto, performance improvements of chemical-amplification negative resists have been studied variously, and the studies as described below have been made particularly from the standpoint of acid generators. Specifically, the acid generators to which studies have been given include the organic halogen compounds disclosed in Japanese Patent Publication No. 3635/1996, the Br- and Cl-substituted aromatic compounds disclosed in Japanese Patent Laid-Open No. 52348/1990, the aromatic compounds containing Br- and Cl-substituted alkyl and alkoxy groups as disclosed in Japanese Patent Laid-Open Nos. 367864/1992 and 367865/1992, the haloalkanesulfonate compounds disclosed in Japanese Patent Laid-Open No. 87746/1991, the iodonium compounds and the sulfonium compounds disclosed in Japanese Patent Laid-Open No. 199770/1994, the phenolic hydroxyl group-containing trifluoromethane sulfonate compounds disclosed in Japanese Patent No. 2,968,055, and the specified benzene sulfonate compounds containing phenolic hydroxyl groups as disclosed in Japanese Patent Laid-Open No. 2001-142200.

However, those compounds, even when they are used in any combinations, were unsuccessful at concurrently satisfying all the resist-performance requirements in the superfine region, namely high sensitivity, high resolution, good pattern profiles and favorable line-edge roughness.

SUMMARY OF THE INVENTION

Therefore, the invention is aimed at solving problems facing the arts of enhancing performances in microlithography for semiconductor devices and, more particularly, providing a negative resist composition which can concurrently satisfy all the characteristics requirements, including high sensitivity, high resolution, good resist pattern profiles and favorable line-edge roughness, notably in electron-beam lithography or X-ray lithography for production of semiconductor devices.

As a result of our intensive studies, it has been found that the aforesaid aims can be attained by a negative resist composition containing an alkali-soluble polymer, a cross-linking agent and a sulfonium-salt type of acid generator having a particular structure, thereby achieving the invention.

(1) A negative resist composition comprising:
(A) an alkali-soluble polymer;
(B) a cross-linking agent that forms a cross-link between the alkali-soluble polymers (A) by the action of an acid; and
(C) an acid generator that is represented by the following formula (I) and is capable of generating an acid upon irradiation with one of an actinic ray and a radiation;

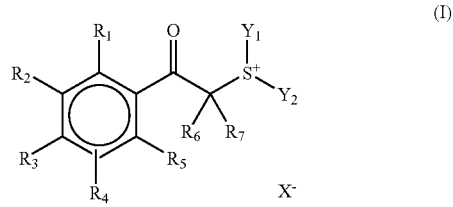

wherein $R_1$ to $R_5$, which are the same or different, each represents a hydrogen atom, a nitro group, a halogen atom, an alkyl group, an alkoxy group, an alkyloxycarbonyl group, an aryl group or an acylamino group; at least two of $R_1$ to $R_5$ may be combined with each other to form a cyclic structure; $R_6$ and $R_7$, which are the same or different, each represents a hydrogen atom, a cyano group, an alkyl group or an aryl group; $Y_1$ and $Y_2$, which are the same or different, each represents an alkyl group or an alkenyl group, with proviso that, when both $Y_1$ and $Y_2$ are alkyl groups, at least one of the alkyl groups represented by $Y_1$ and $Y_2$ has one of a hydroxyl group, an ether linkage group and a sulfide linkage group, or the alkyl groups represented by $Y_1$ and $Y_2$ each contains at least two carbon atoms; $Y_1$ and $Y_2$ may be combined with each other to form a ring together with $S^+$; at least one of $R_1$ to $R_5$ and at least one of $Y_1$ and $Y_2$ may be combined with each other to form a ring; at least one of $R_1$ to $R_5$ and at least one of $R_6$ and $R_7$ may be combined with each other to form a ring; at least two of the compounds represented by formula (I) may combine with each other via a linkage group at the site of any one of $R_1$ to $R_7$, $Y_1$ and $Y_2$ to form a dimmer or more; $X^-$ represents a non-nucleophilic anion.

(2) The negative resist composition as described in the item (1), which further comprises (D) a nitrogen-containing basic compound.

(3) The negative resist composition as described in the item (1), which further comprises an acid generator other than the acid generator (C) represented by formula (I), capable of generating an acid upon irradiation with actinic rays or radiation.

(4) The negative resist composition as described in the item (1), wherein the alkali-soluble polymer (A) is a copolymer containing a repeating unit having a mononuclear aromatic structure and a repeating unit having a polynuclear aromatic structure.

(5) The negative resist composition as described in the item (1), wherein the alkali-soluble polymer (A) contains a repeating unit represented by the following formula (b):

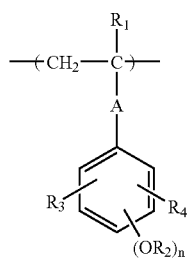

(b)

wherein $R_1$ represents a hydrogen atom, a halogen atom, a cyano group or an unsubstituted or substituted alkyl group; $R_2$ represents a hydrogen atom, an alkyl, cycloalkyl, aryl, aralkyl or acyl group which are unsubstituted or substituted; $R_3$ and $R_4$, which are the same or different, each represents a hydrogen atom, a halogen atom, a cyano group, an alkyl, cycloalkyl, alkenyl, aralkyl or aryl group which are unsubstituted or substituted; A represents a single bond, an alkylene, alkenylene, cycloalkylene or arylene group which are unsubstituted or substituted, —O—, —SO$_2$—, —O—CO—$R_5$—, —CO—O—$R_6$—, or —CO—N($R_7$)—$R_8$—; $R_5$, $R_6$ and $R_8$ each represents a single bond, an alkylene, alkenylene, cycloalkylene or arylene group which are unsubstituted or substituted, or a divalent group formed of: at least one of the above groups; and at least one structure selected from the group consisting of an ether structure, an ester structure, an amide structure, an urethane structure and an ureide structure; $R_7$ represents a hydrogen atom, or an alkyl, cycloalkyl, aralkyl or aryl group which are unsubstituted or substituted; n represents an integer of 1 to 3; plural $R_2$ may be combined together or one $R_2$ may be combined with $R_3$ or $R_4$ to form a ring.

(6) The negative resist composition as described in the item (5), wherein the alkali-soluble polymer (A) contains the repeating unit represented by the formula (b) in an amount of 5 to 100% by mole based on the total repeating units in the polymer (A).

(7) The negative resist composition as described in the item (1), wherein the alkali-soluble polymer (A) contains at least one of repeating units selected from a repeating unit represented by the following formula (b-2) and a repeating unit represented by the following formula (b-3):

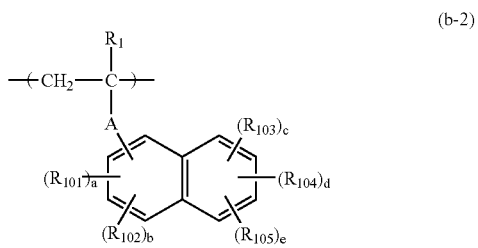

(b-2)

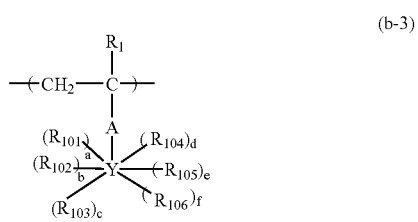

(b-3)

wherein $R_1$ and A have the same meanings as in the formula (b) respectively; $R_{101}$ to $R_{106}$ each independently represents a hydroxyl group, a carboxyl group, an amino group, an alkyl, cycloalkyl, alkoxy, alkylcarbonyloxy, alkylsulofnyloxy, alkenyl, aryl, aralkyl, N-alkylamino or N-dialkylamino group which are unsubstituted or substituted; at of each independently represents an integer of 0 to 3; Y represents a condensed polynuclear aromatic structure selected from the structures below:

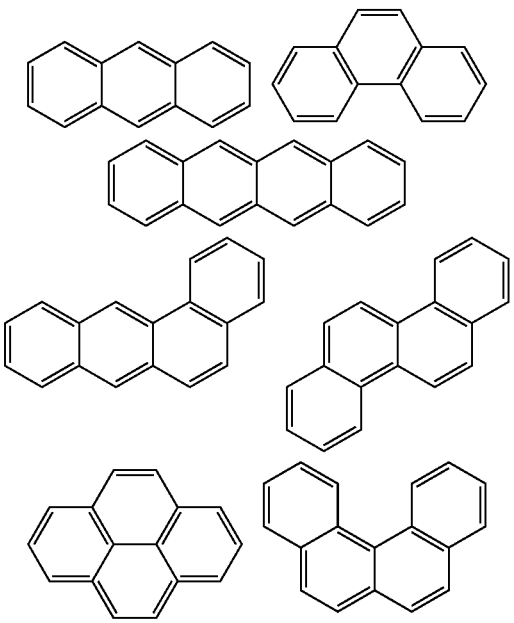

-continued

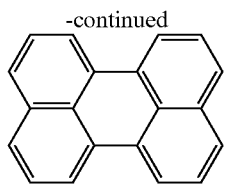

(8) The negative resist composition as described in the item (7), wherein the alkali-soluble polymer (A) contains the at least one of repeating units selected from the repeating unit represented by the formula (b-2) and the repeating unit represented by the formula (b-3) in an amount of 3 to 50% by mole based on the total repeating units in the polymer (A).

(9) The negative resist composition as described in the item (1), wherein the cross-linking agent (B) comprises at least one selected from the group consisting of: a compound or resin which each contains at least two of a hydroxylmethyl, alkoxymethyl, acyloxymethyl and alkoxymethyl ether group; and an epoxy compound.

(10) The negative resist composition as described in the item (1), wherein the cross-linking agent (B) comprises a phenol derivative having; a molecular weight of 1,200 or below; 3 to 5 benzene rings in its molecule; and at least one of a hydroxymethyl and alkoxymethyl groups in the total number of at least two in its molecule,
wherein the hydroxymethyl and alkoxymethyl groups bind to the 3 to 5 benzene rings.

(11) The negative resist composition as described in the item (1), wherein in the formula (I), the non-nucleophilic anion as $X^-$ is at least one of a sulfonic acid anion, a carboxylic acid anion, a bis(alkylsulfonyl)imide anion and a tris(alkylsulfonyl)methyl anion.

(12) The negative resist composition as described in the item (11), wherein the sulfonic acid anion is at least one of an alkylsulfonic acid anion, an arylsulfonic acid anion and a camphorsulfonic acid anion.

(13) The negative resist composition as described in the item (1), wherein in the formula (I), the non-nucleophilic anion as $X^-$ is a sulfonic acid anion containing at least one fluorine atom.

(14) The negative resist composition as described in the item (13), wherein in the formula (I), the non-nucleophilic anion as $X^-$ is a sulfonic acid anion that is substituted by a fluorine atom at the 1-position.

(15) The negative resist composition as described in the item (13), wherein in the formula (I), the non-nucleophilic anion as $X^-$ is a perfluoroalkanesulfonic acid anion.

(16) The negative resist composition as described in the item (13), wherein in the formula (I), the non-nucleophilic anion as $X^-$ is a benzenesulfonic acid anion containing a fluorine atom or a fluorine-containing substituent.

DETAILED DESCRIPTION OF THE INVENTION

The compounds used in the invention are illustrated below in detail.

[1] Alkali-Soluble Polymer of Component (A) Used in the Invention:

The alkali-soluble polymers usable in the invention include a wide variety of polymers containing phenol skeletons, which use in negative resists of chemical amplification type has so far been disclosed, such as phenol novolak resins, polyvinyl phenol resins, copolymers having structural units derived from vinyl phenols and resins obtained by partially protecting or modifying polyvinyl phenol resins. Of these resins, the phenol resins containing structural repeating units represented by the foregoing formula (b) are preferred over others.

In formula (b), $R_1$ represents a hydrogen atom, a halogen atom, a cyano group, or an alkyl group which may have a substituent.

$R_2$ represents a hydrogen atom, or an alkyl, cycloalkyl, aryl, aralkyl or acyl group which may have a substituent.

$R_3$ and $R_4$, which may be the same or different, each represent a hydrogen atom, a halogen atom, a cyano group, or an alkyl, cycloalkyl, alkenyl, aralkyl or aryl group which may have a substituent. The case where both $R_3$ and $R_4$ are hydrogen atoms means that neither $R_3$ nor $R_4$ forms a substituent on the benzene ring in formula (b).

A represents a single bond, or an alkylene, alkenylene, cycloalkylene or arylene group which may have a substituent, or —O—, —SO$_2$—, —O—CO—R$_5$—, —CO—O—R$_6$— or —CO—N(R$_7$)—R$_8$—.

$R_5$, $R_6$ and $R_8$ each represent a single bond, an alkylene, alkenylene, cycloalkylene or arylene group which may have a substituent, or a divalent group formed of at least one of the divalent groups recited above and at least one structure selected from the group consisting of an ether structure, an ester structure, an amide structure, an urethane structure and an ureide structure.

$R_7$ represents a hydrogen atom, or an alkyl, cycloalkyl, aralkyl or aryl group which may have a substituent.

n represents an integer of 1 to 3. When n is 2 or 3, one of $R_2$s may be combined with another $R_2$, $R_3$ or $R_4$ to form a ring.

The alkyl group represented by $R_1$ to $R_4$ and $R_7$ each is, e.g., an alkyl group containing 1 to 8 carbon atoms. Suitable examples thereof include a methyl group, an ethyl group, a propyl group, a n-butyl group, a sec-butyl group, a hexyl group, a 2-ethylhexyl group and an octyl group.

The cycloalkyl group represented by $R_2$ to $R_4$ and $R_7$ each may be a monocyclic or polycyclic group. Suitable examples of such a monocyclic group include those containing 3 to 8 carbon atoms, such as a cyclopropyl group, a cyclopentyl group and a cyclohexyl group. And suitable examples of such a polycyclic group include an adamantyl group, a norbornyl group, an isobornyl group, dicyclopentyl group, an α-pinyl group and a tricyclodecanyl group.

The alkenyl group represented by $R_3$ and $R_4$ each is, e.g., an alkenyl group containing 2 to 8 carbon atoms, with suitable examples including a vinyl group, an allyl group, a butenyl group and a cyclohexenyl group.

The aryl group represented by $R_2$ to $R_4$ and $R_7$ each is, e.g., an aryl group containing 6 to 15 carbon atoms, with suitable examples including a phenyl group, a tolyl group, a dimethylphenyl group, a 2,4,6-trimethylphenyl group, a naphthyl group and an anthryl group.

The aralkyl group represented by $R_2$ to $R_4$ and $R_7$ each is, e.g., an aralkyl group containing 7 to 12 carbon atoms, with suitable examples including a benzyl group, a phenetyl group and a naphthylmethyl group.

The acyl group represented by $R_2$ is, e.g., an acyl group containing 1 to 8 carbon atoms, with suitable examples including a formyl group, an acetyl group, a propanoyl group, butanoyl group, a pivaroyl group and a benzoyl group.

The alkylene group represented by A, $R_5$, $R_6$ and $R_8$ each is preferably a 1–8C alkylene group (alkylene group containing 1 to 8 carbon atoms) which may have a substituent, such as a methylene group, an ethylene group, a propylene group, a butylene group, a hexylene group or an octylene group.

The alkenylene group represented by A, $R_5$, $R_6$ and $R_8$ each is preferably a 2–6C alkenylene group which may have a substituent, such as an ethenylene group, a propenylene group or a butenylene group.

The cycloalkylene group represented by A, $R_5$, $R_6$ and $R_8$ each is preferably a 5–8C cycloalkylene group which may have a substituent, such as a cyclopentylene group or a cyclohexylene group.

The arylene group represented by A, $R_5$, $R_6$ and $R_8$ each is preferably a 6–12C arylene group, such as a phenylene group, a tolylene group and a naphthylene group.

Each of the alkyl groups, the cycloalkyl groups, the aryl groups, the aralkyl groups, the acyl groups, the alkenyl groups, the alkenylene groups, the cycloalkylene groups and the arylene groups as recited above may have a substituent.

Examples of a substituent those groups each may have include active hydrogen-containing groups, such as an amino group, an amido group, an ureido group, an urethane group, a hydroxyl group and a carboxyl group; halogen atoms, such as a fluorine atom, a chlorine atom, a bromine atom and an iodine atom; alkoxy groups, such as a methoxy group, an ethoxy group, a propoxy group and a butoxy group; a thioether group; acyl groups, such as an acetyl group, a propanoyl group and a benxoyl group; acyloxy groups, such as an acetoxy group, a propanoyloxy group and a bennxoyloxy group; alkoxycarbonyl groups, such as a methoxycarbonyl group, an ethoxycarbonyl group and a propoxycarbonyl group; a cyano group; and a nitro group. Of these substituents, active hydrogen-containing groups including an amino group, a hydroxyl group and a carboxyl group are preferred in particular.

Examples of a ring formed by combining more than one $R_2$ together, or combining one $R_2$ with $R_3$ or $R_4$ include oxygen-containing 4- to 7-membered ring, such as a benzofuran ring, a benzodioxonol ring and a benzopyran ring.

The polymer of the present Component (A), though may be constituted only of structural repeating units of formula (b), can further contain structural units derived from other copolymerizing monomers for the purpose of enhancing performances of the present negative resist.

Examples of usable copolymerizing monomers include compounds, which each contain one addition-polymerizable unsaturated bond, selected from among acrylic acid esters, acrylamides, methacrylic acid esters, methacrylamides, allyl compounds, vinyl ethers, vinyl esters, styrenes or crotonic esters, other than the monomers from which the structural repeating units of formula (b) are derived.

Of these compounds, monomers capable of increasing alkali solubility, such as carboxyl group-containing monomers (e.g., carboxystyrene, N-(carboxyphenyl)acrylamide and N-(carboxyphenyl)methacrylamide) and maleimide, are preferred as copolymer constituents.

The suitable proportion of other polymerizing monomers in the present polymer is at most 50 mole %, preferably at most 30 mole %, to the total repeating units.

Examples of a polymer containing structural repeating units of formula (b) are illustrated below, but it should be understood that these examples are not to be construed as limiting the scope of the invention in any way.

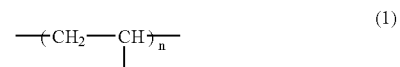

(1)

(2)

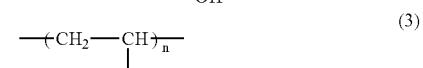

(3)

(4)

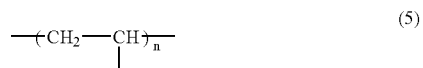

(5)

(6)

(7)

(8)

-continued
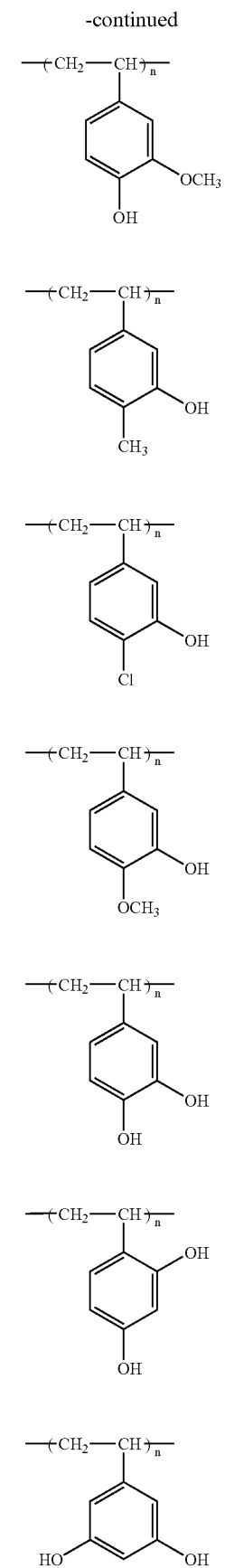
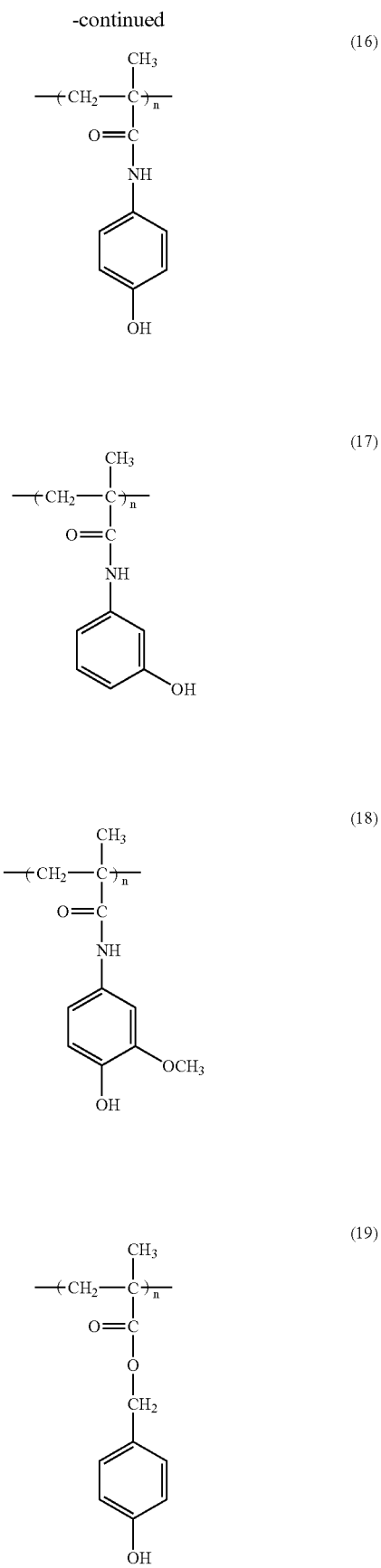

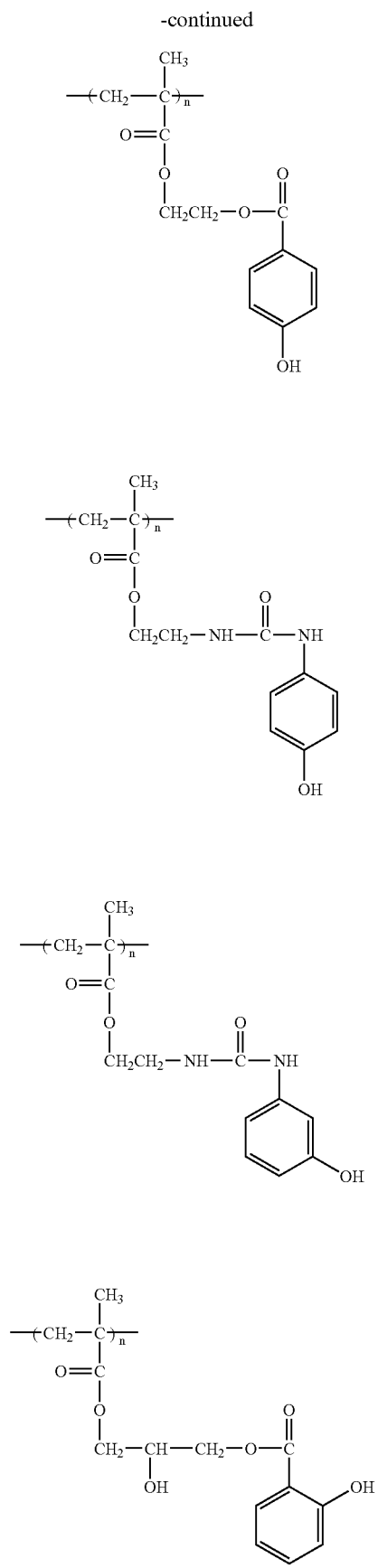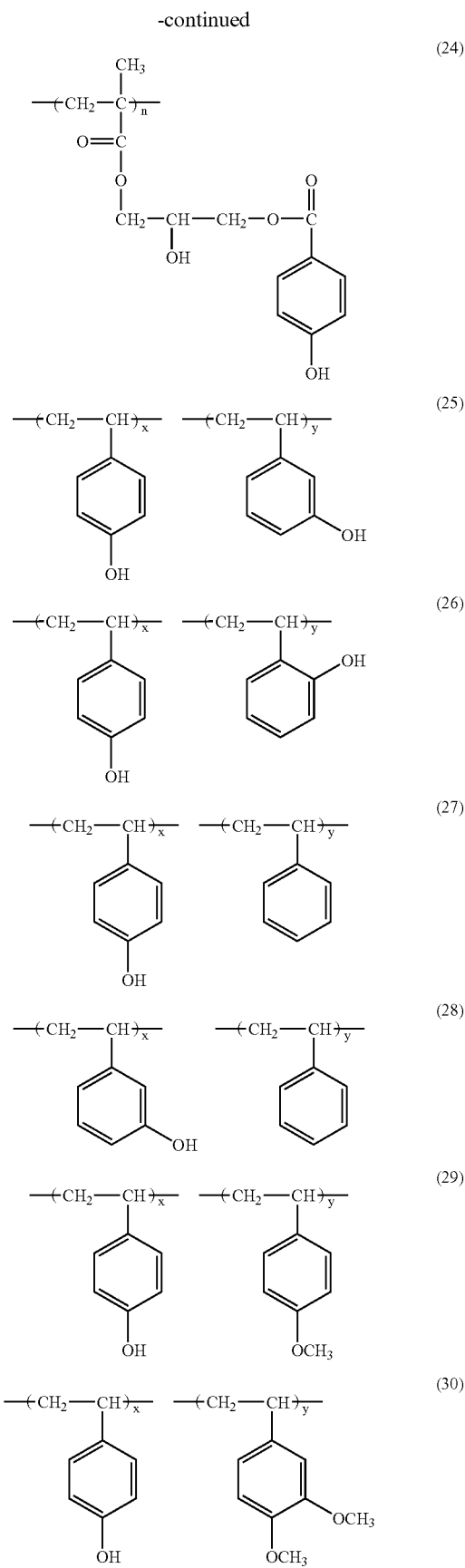

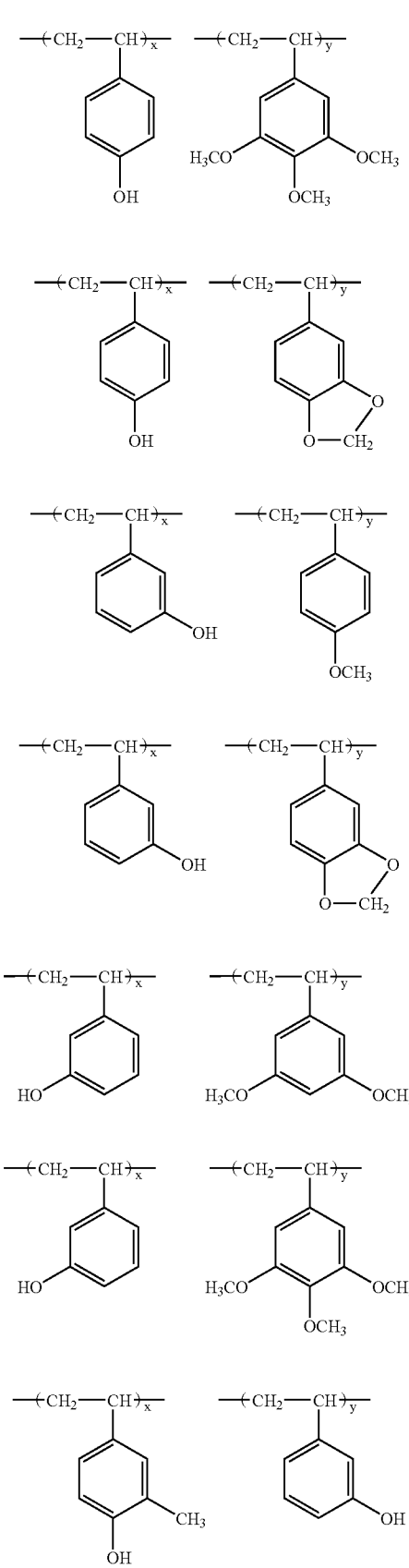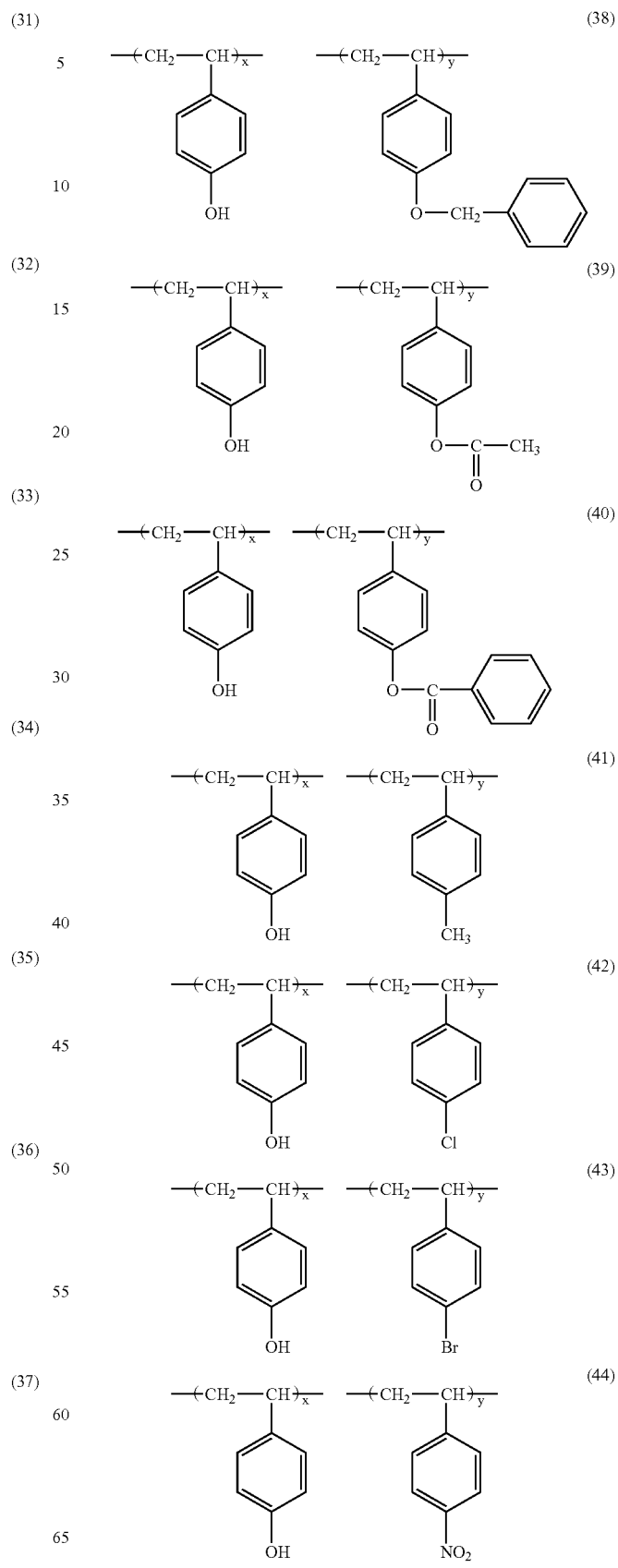

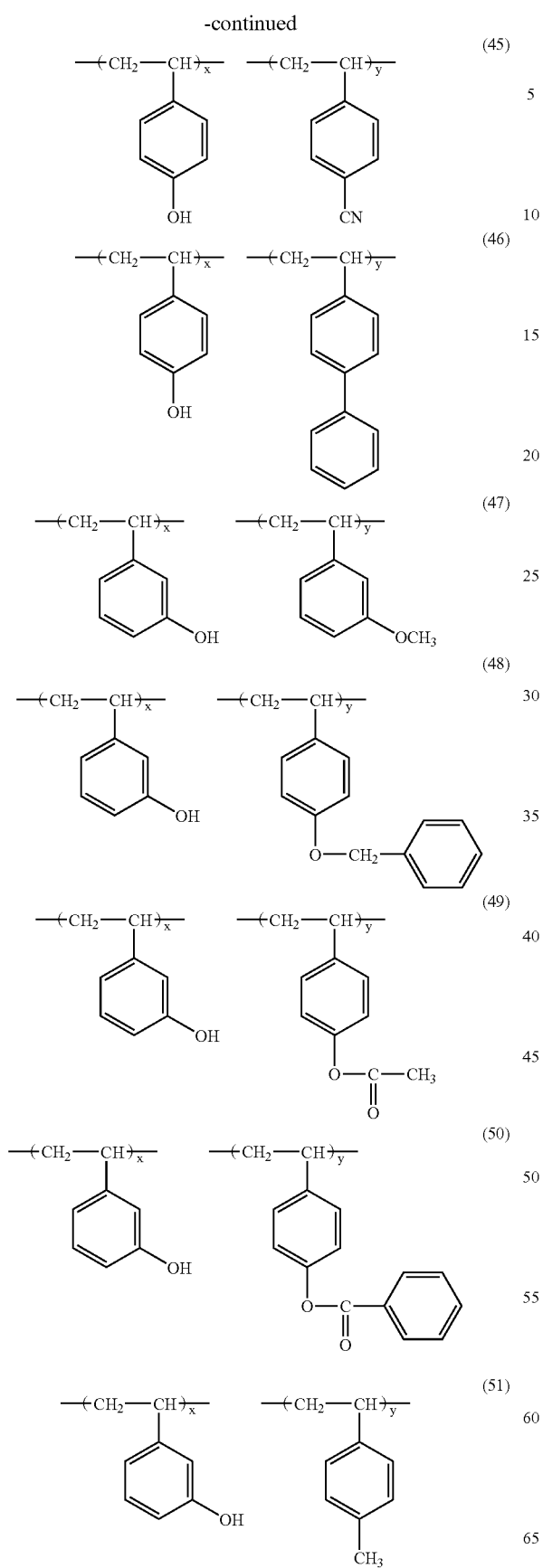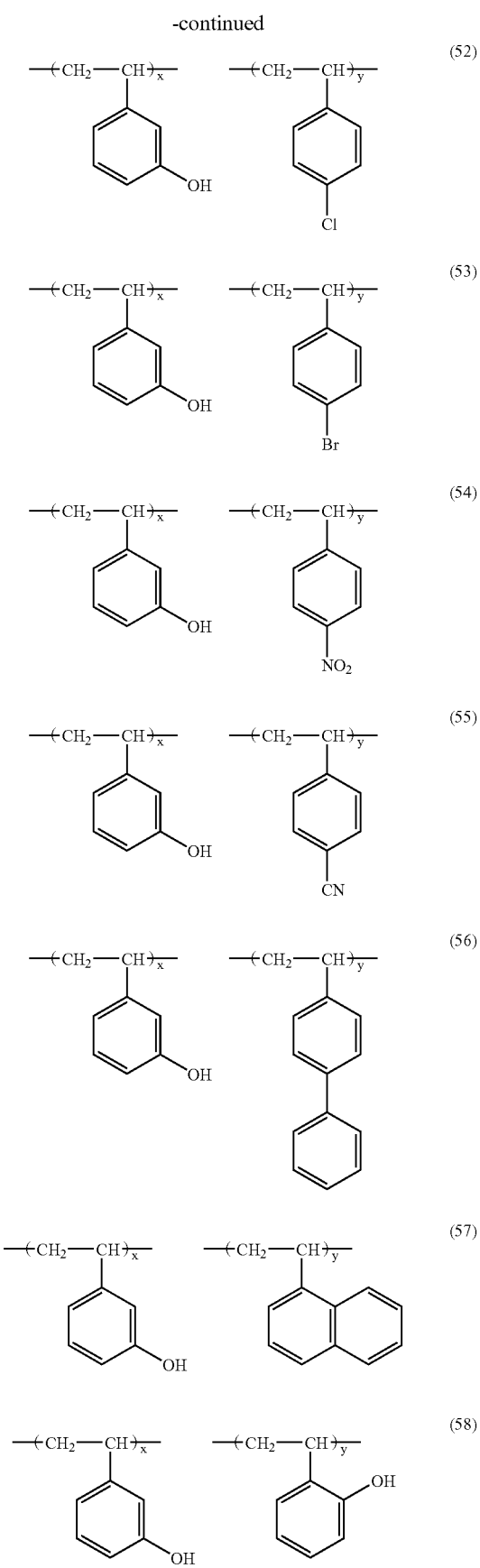

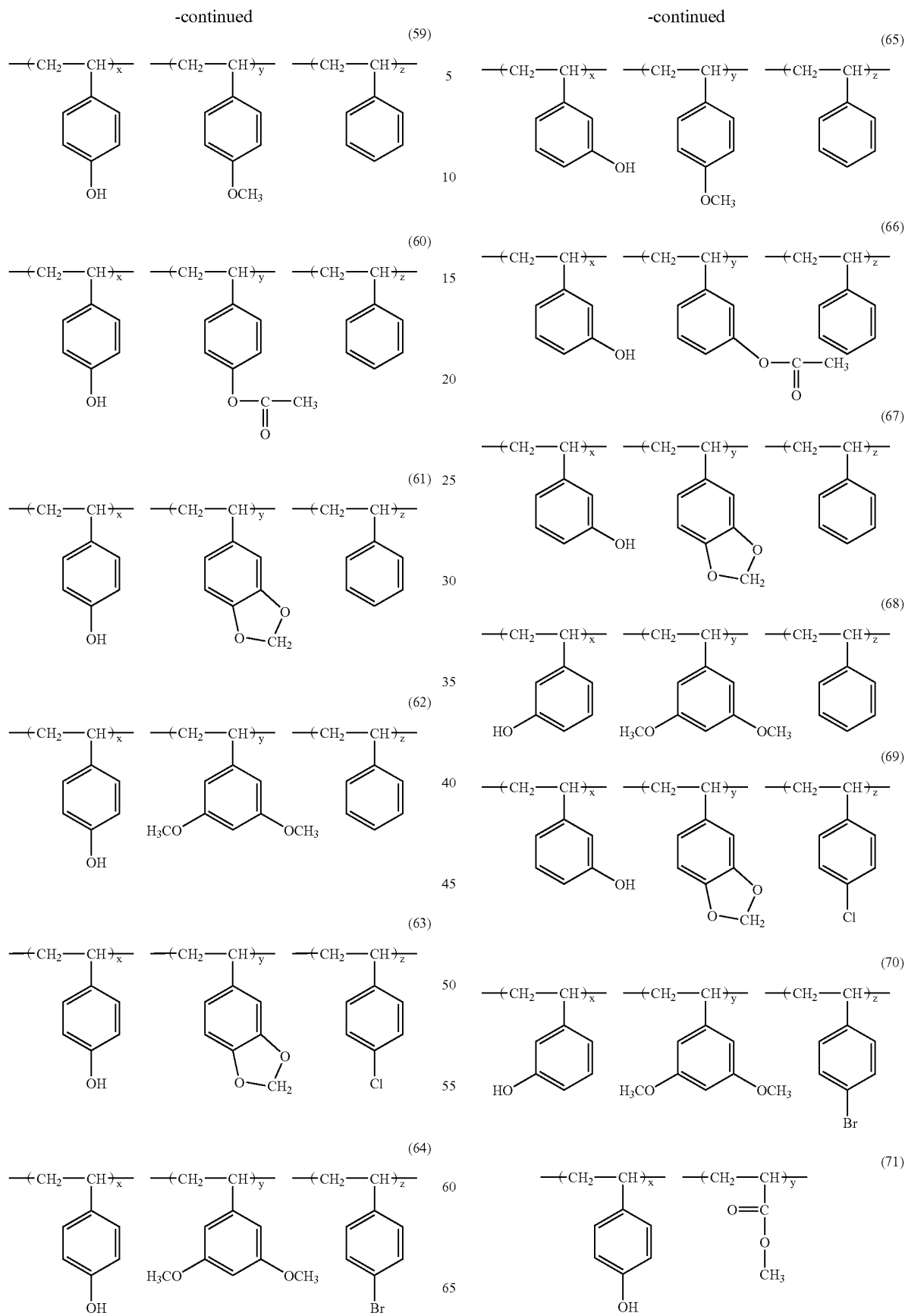

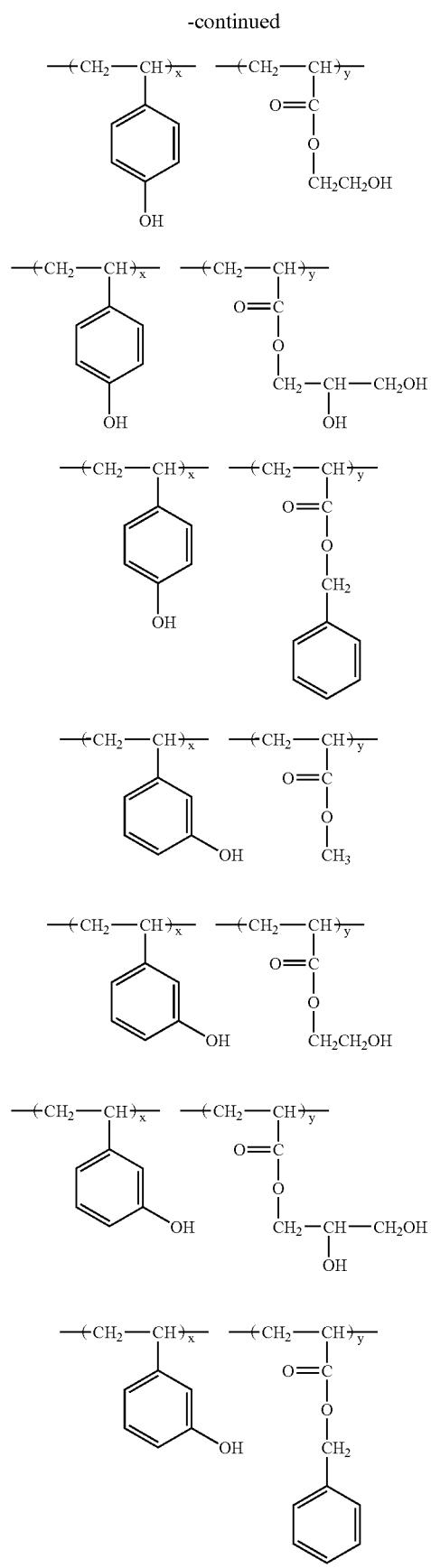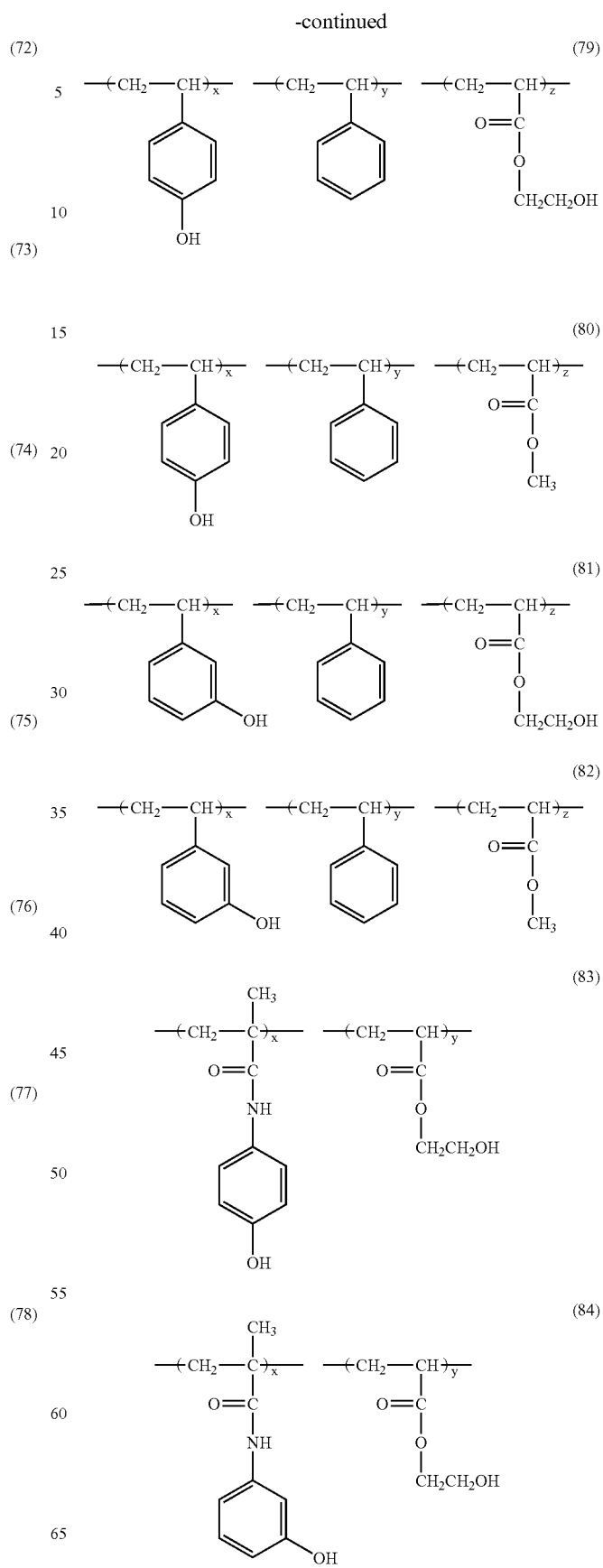

(85)
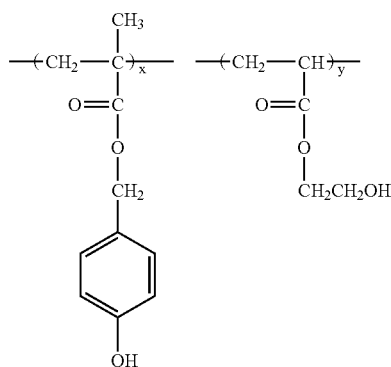
(86)
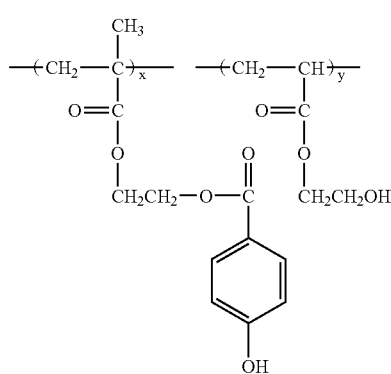
(87)
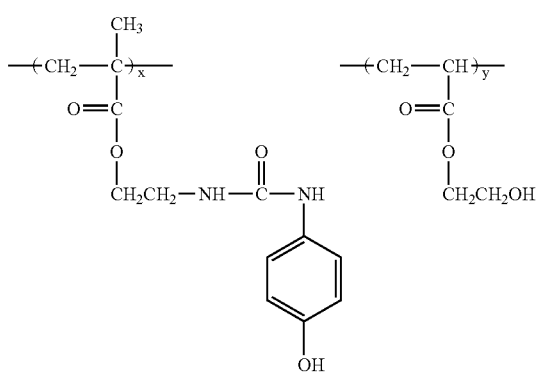
(88)
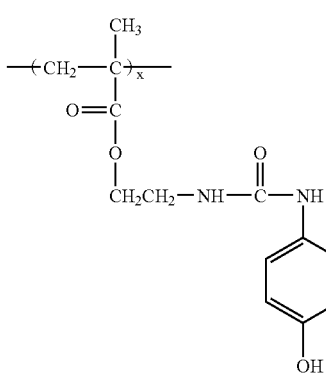
(89)
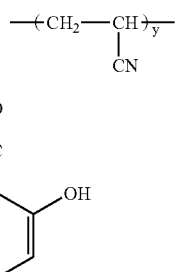
(90)
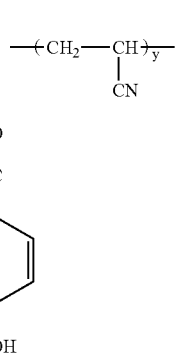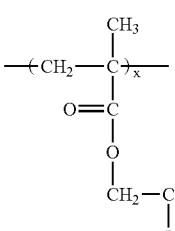
(91)
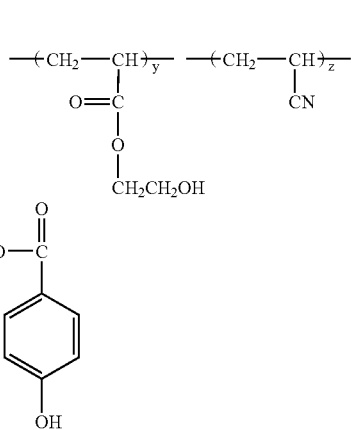
(92)
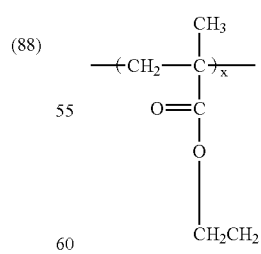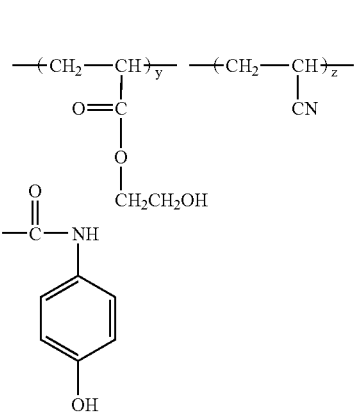

n in some of the examples illustrated above represents a positive integer. x, y and z represent polymer constituents' percentages by mole. As to the two-constituent polymers usable in the invention, x is in the range of 10 to 95 and y in the range of 5 to 90, and preferably x is in the range of 40 to 90 and y in the range of 10 to 60. As to the three-constituent polymers usable in the invention, x is in the range of 10 to 90, y in the range of 5 to 85 and z in the range of 5 to 85. Preferably, x is in the range of 40 to 80, y in the range of 10 to 50 and z in the range of 10 to 50.

The appropriate molecular weight of an alkali-soluble polymer (A), preferably a polymer containing structural repeating units of formula (b), is in the range of 1,000 to 200,000, preferably 3,000 to 50,000, on a weight average. The molecular weight distribution is from 1 to 10, favorably from 1 to 3, more favorably from 1 to 1.5. The narrower the molecular distribution, the more excellent the resolution and the resist profiles, and further the smoother the side walls of resist patterns, in other words, the more satisfactory the roughness.

The proportion of the structural repeating units of formula (b) to the total structural units in the polymer is from 5 to 100% by mole, preferably from 10 to 90% by mole.

The alkali-soluble polymers used in the invention, which contain structural units represented by formula (b), can be synthesized using the methods described in *Macromolecules,* 28(11), 3787–3789 (1995), *Polym. Bull. (Berlin),* 24(4), 385–389 (1990), and Japanese Patent Laid-Open No. 286375/1996. Specifically, the intended alkali-soluble polymers can be obtained by radical polymerization or living anion polymerization methods.

These polymers may be used alone or as a mixture of two or more thereof.

The term "weight average molecular weight" used herein is defined as the molecular weight measured by gel permeation chromatography and calculated in terms of polystyrene.

It is appropriate that the alkali-soluble polymers be dissolved in alkalis at a speed of at least 20 Å/sec, particularly preferably at least 200 Å/sec, as measured using 0.261 N tetramethylammonium hydroxide (TMAH) at 23° C.

The present alkali-soluble polymers, though may be used alone, can be used in combination with other alkali-soluble polymers. The alkali-soluble polymers other than the present alkali-soluble polymers can be used in a proportion of at most 100 parts by weight to 100 parts by weight of the present alkali-soluble polymers. The alkali-soluble polymers usable in combination with the present ones are illustrated below.

Examples of such alkali-soluble polymers include novolak resins, hydrogenated novolak resins, acetone-pyrogallol resins, styrene-maleic anhydride copolymers, carboxyl group-containing methacrylic resins and derivatives thereof. However, resins usable in combination should not be construed as being limited to those recited above.

The polymer (A) is used in a proportion of 30 to 95 weight %, preferably 40 to 90 weight %, particularly preferably 50 to 80 weight %, to the total solids in the composition.

It is also appropriate for the alkali-soluble polymer of Component (A) used in the invention to have repeating units represented by formula (b-2) or (b-3).

In formulae (b-2) and (b-3), $R_1$ has the same meaning as in formula (b).

A has the same meaning as in formula (b).

$R_{101}$ to $R_{106}$ independently represent a hydroxyl group, a carboxyl group, an amino group, or an unsubstituted or substituted alkyl, cycloalkyl, alkoxy, alkylcarbonyloxy, alkylsulfonyloxy, alkenyl, aryl, aralkyl, N-alkylamino or N-dialkylamino group. It is preferable that each of $R_{101}$ to $R_{106}$ be a hydroxyl group, a 1–6C linear or branched alkyl group, a 1–6C alkoxy group, a 1–6C alkylcarbonyloxy group or a phenyl group, especially a hydroxyl group, a 1–4C linear or branched alkyl group (e.g., methyl, ethyl, n-propyl, n-butyl, t-butyl), a 1–3C alkoxy group (e.g., methoxy, ethoxy) or a phenyl group. a to f independently represent an integer of 0 to 3, preferably an integer of 0 to 2.

The alkyl group and the alkyl moiety in each of the alkoxy, alkylcarbonyloxy, alkylsulfonyloxy, N-alkylamino and N-dialkylamino groups are those having linear or branched structures, with suitable examples including a methyl group, an ethyl group, a propyl group, a n-butyl group, a sec-butyl group, a hexyl group, a 2-ethylhexyl group and an octyl group. The cycloalkyl group may be a monocyclic or polycyclic alkyl group. Suitable examples of the monocyclic alkyl group include a cyclopropyl group, a cyclopentyl group and a cyclohexyl group, and those of the polycyclic alkyl group include an adamantyl group, a norbornyl group, an isobornyl group, a dicylopentyl group, an α-pinyl group and a tricyclodecanyl group.

Suitable examples of the alkenyl group include a vinyl group, an allyl group, a butenyl group and a cyclohexenyl group.

Suitable examples of the aryl group include a phenyl group, a tolyl group, a dimethylphenyl group, a 2,4,6-trimethylphenyl group, a naphthyl group and an anthryl group.

Suitable examples of the aralkyl group include a benzyl group, a phenetyl group and a naphthylmethyl group.

Y represents any of the condensed polynuclear aromatic structures illustrated hereinbefore.

In such a condensed polynuclear aromatic structure represented by Y, the position of a bonding hand by which Y binds to the main chain or the positions of bonding hands by which Y combines with substituents may be any of the bonding sites present on the condensed polynuclear aromatic structure.

The alkyl, cycloalkyl, aryl, alkoxy, alkylcarbonyloxy, alkylsulfonyloxy, aralkyl, alkenyl, N-alkylamino and N-dialkylamino groups as recited above may have substituents.

Examples of substituents by which those groups may be substituted include active hydrogen-containing groups, such as an amino group, an amido group, an ureido group, an urethane group, a hydroxyl group and a carboxyl group, halogen atoms (e.g., fluorine, chlorine, bromine, iodine), alkoxy groups (e.g., methoxy, ethoxy, propoxy, butoxy), a thioether group, acyl groups (e.g., acetyl, propanoyl, benzoyl), acyloxy groups (e.g., acetoxy, propanoyloxy, benzoyloxy), alkoxycarbonyl groups (e.g., methoxycarbonyl, ethoxycarbonyl, propoxycarbonyl), a cyano group and a nitro group.

The suitable proportion of the repeating units represented by formula (b-2) and/or formula (b-3) in the present polymer is from 3 to 50 mole %, preferably from 5 to 40 mole %, to the total repeating units.

Examples of alkali-soluble polymers having condensed polynuclear aromatic structures which can be used in the invention are illustrated below, but these examples should not be construed as limiting the scope of the invention.

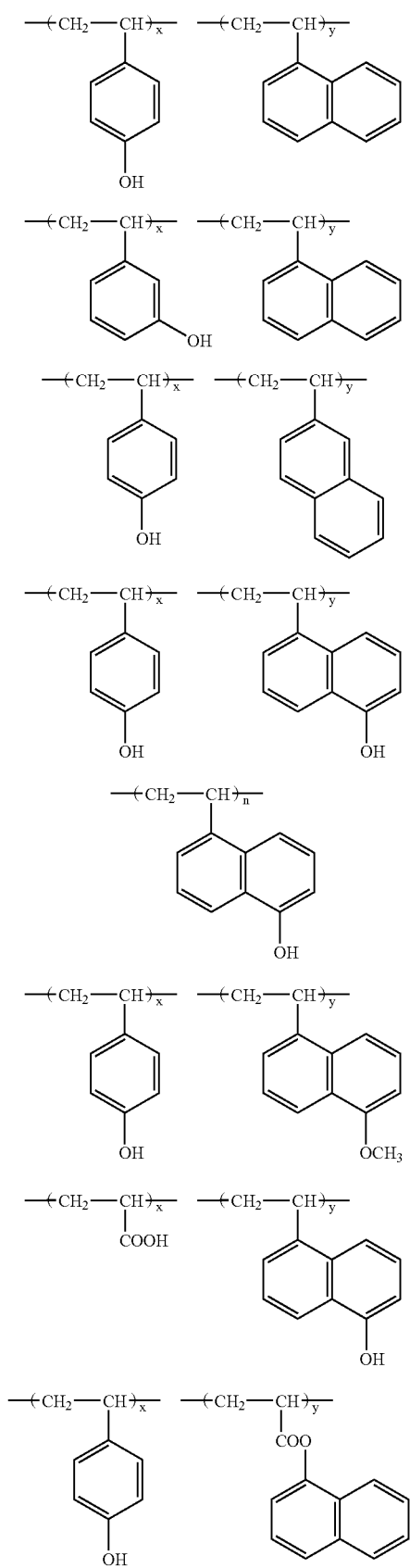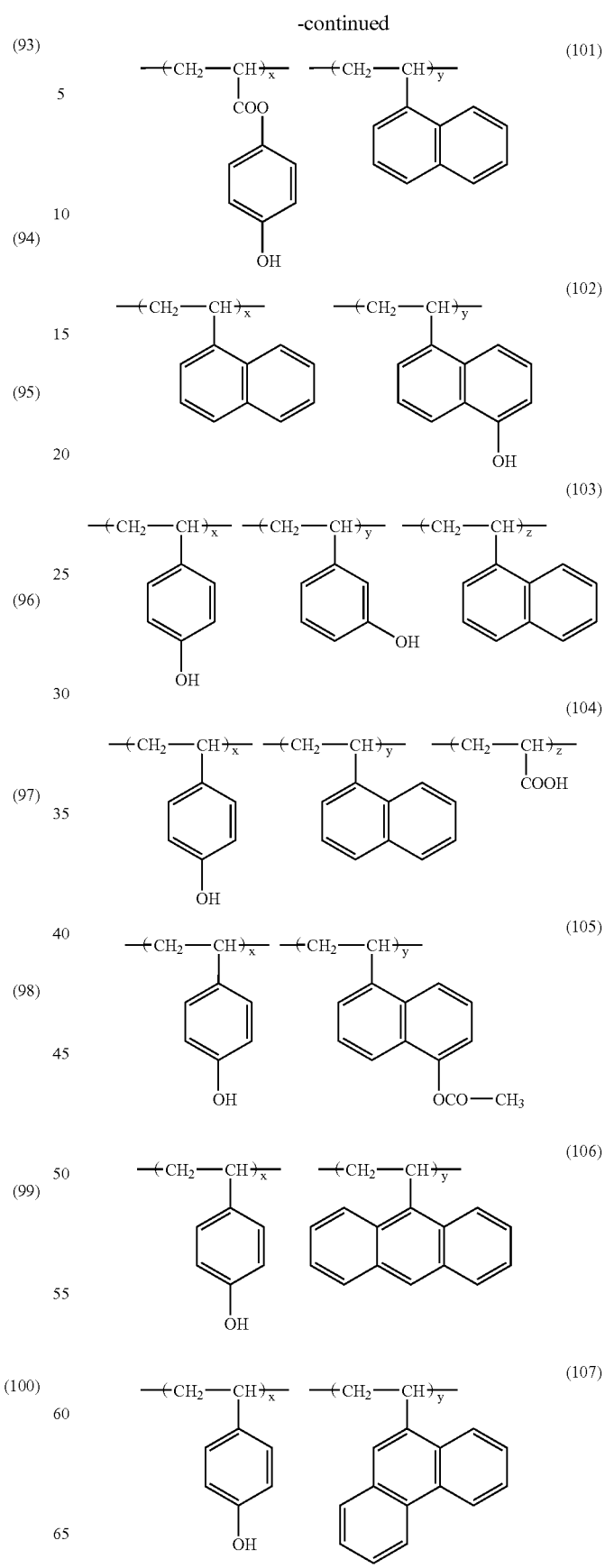

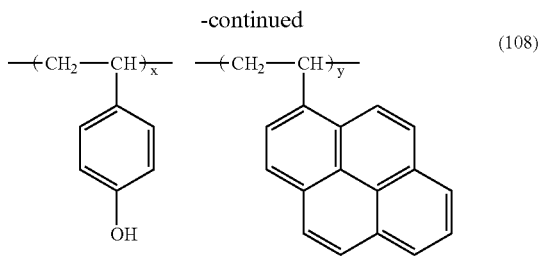

(108)

As the alkali-soluble polymer of Component (A) in the invention, a copolymer containing repeating units having mononuclear aromatic structures and repeating units having polynuclear aromatic structures is more suitable.

[2] Acid Cross-Linking Agent of Component (B) Used in the Invention:

In the invention, a compound capable of forming cross-links by the action of an acid (hereinafter referred simply to as an acid cross-linking agent or a cross-linking agent as appropriate) is used in combination with the alkali-soluble polymer as recited above. Herein, known acid cross-linking agents can be utilized.

Of known agents, compounds or resins which each contain at least two hydroxylmethyl, alkoxymethyl, acyloxymethyl or alkoxymethyl ether groups, and epoxy compounds are suitable in the invention.

Examples of more suitable cross-linking agents include alkoxymethylated melamine compounds or resins, acyloxymethylated melamine compounds or resins, alkoxymethylated urea compounds or resins, acyloxymethylated urea compounds or resins, hydroxymethylated phenol compounds or resins, alkoxymethylated phenol compounds or resins, and alkoxymethyl etherified phenol compounds or resins.

In particular, it is advantageous to use phenol derivatives as the cross-linking agent. As the phenol derivatives, suitable are those having molecular weight of 1,200 or below and 3 to 5 benzene rings per molecule and containing hydroxymethyl or/and alkoxymethyl groups in the total number of at least two per molecule, wherein the hydroxylmethyl or/and alkoxymethyl groups may be converged on or allocated among at least some of the benzene rings. By the use of such phenol derivatives, the present composition can achieve more remarkable effects.

The alkoxymethyl groups preferably attached to benzene rings are those containing up to 6 carbon atoms. Suitable examples of such alkoxymethyl groups include a methoxymethyl group, an ethoxymethyl group, a n-propoxymethyl group, an i-propoxymethyl group, a n-butoxymethyl group, an i-butoxymethyl group, a sec-butoxymethyl group and a t-butoxymethyl group.

In addition, alkoxy-substituted alkoxy groups, such as 2-methoxyethoxy and 2-methoxy-1-propoxy groups, are also suitable as substituents of phenol derivatives.

Of these phenol derivatives, the compounds illustrated below are preferred in particular:

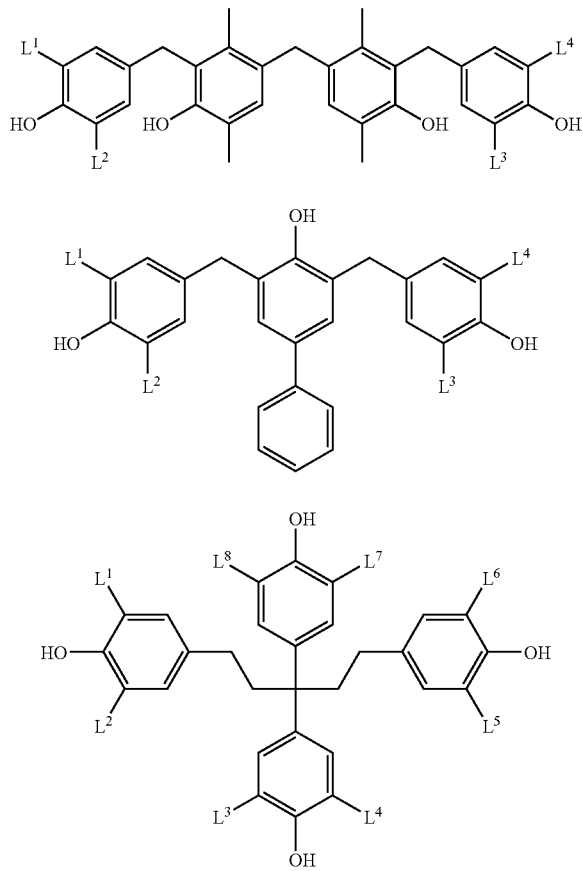

-continued
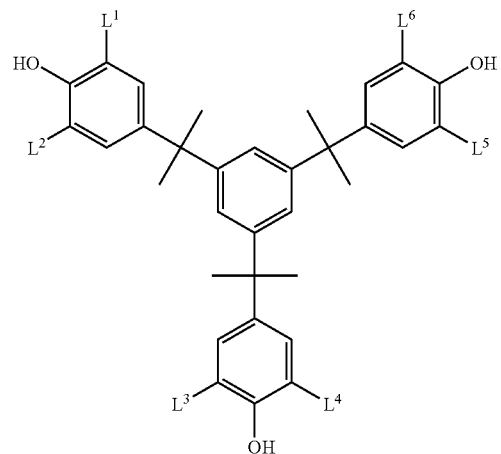
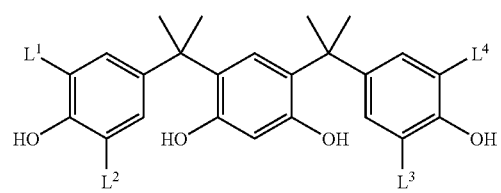
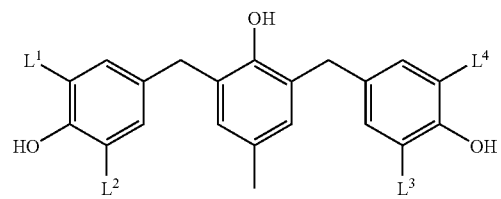
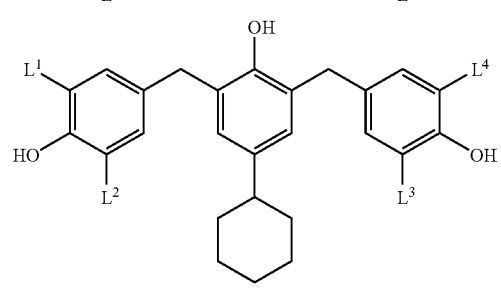
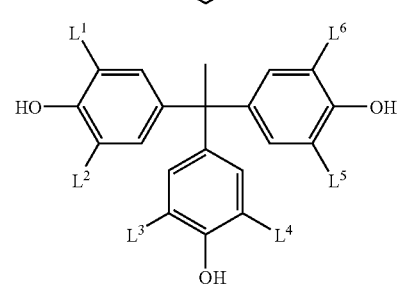
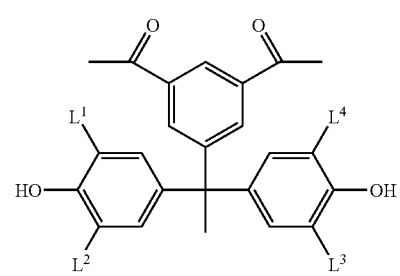

-continued
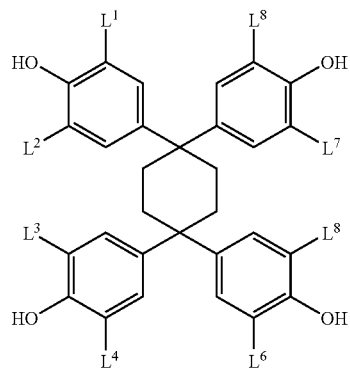
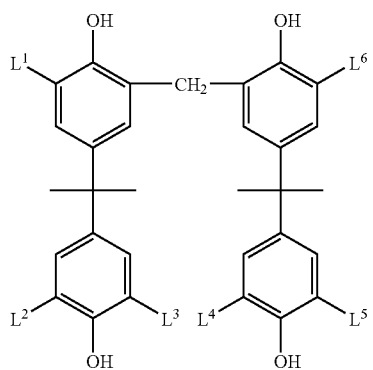
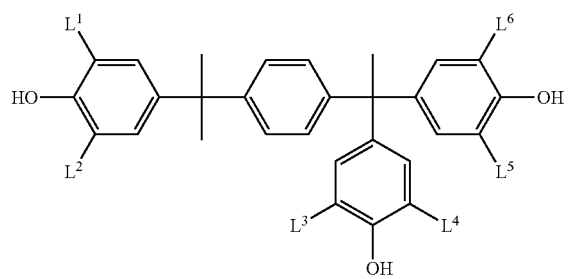
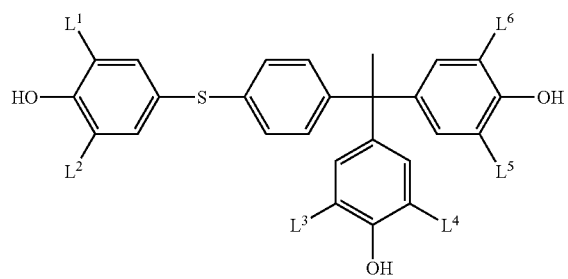
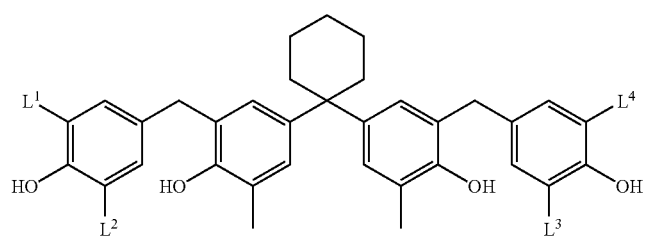

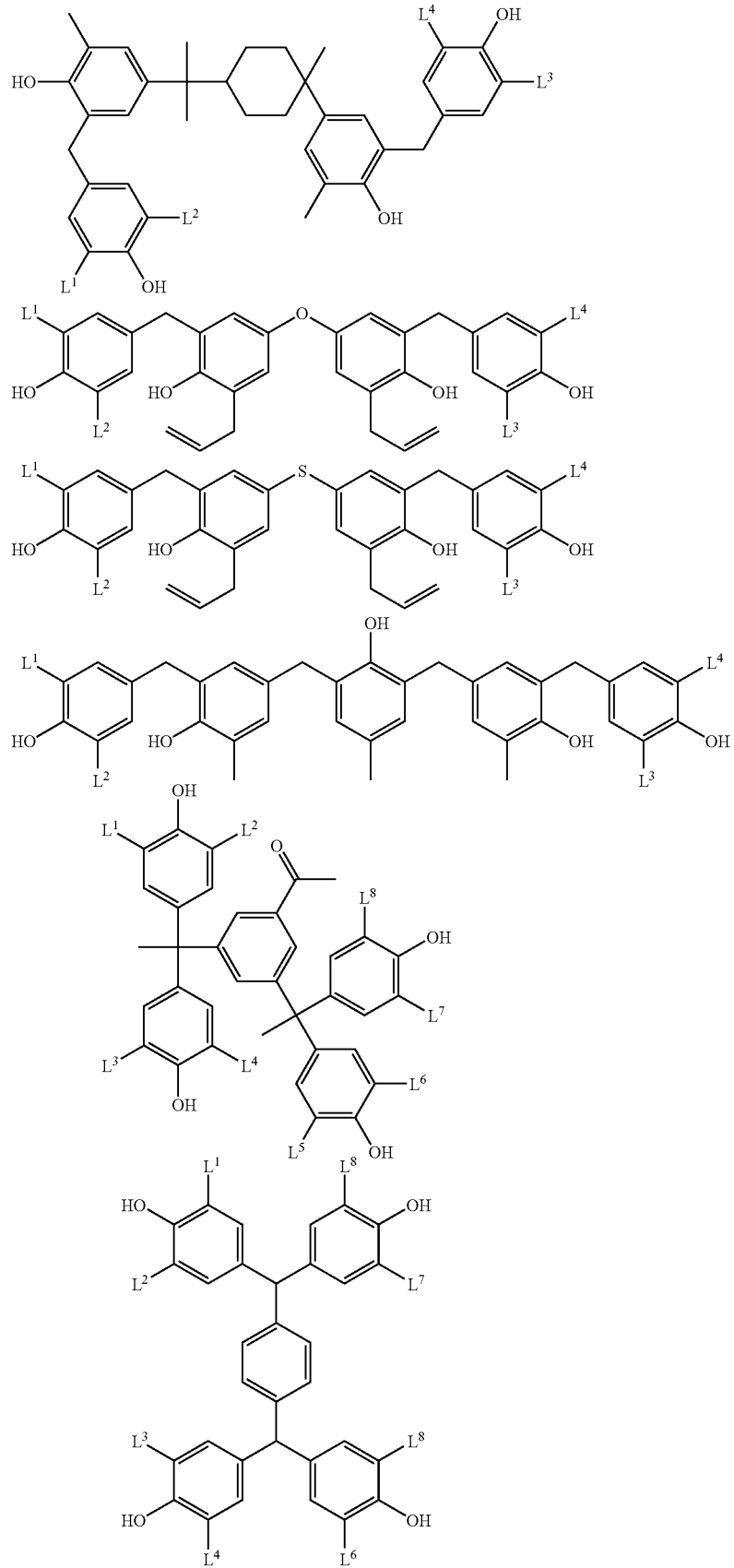

In the foregoing structural formulae, $L^1$ to $L^8$, which may be the same or different, each represents hydroxymethyl group, a methoxymethyl group or an ethoxymethyl group.

Phenol derivatives having hydroxymethyl groups can be prepared by reaction between the corresponding hydroxymethyl groups-free phenol compounds (or the compounds represented by the above structural formulae wherein $L^1$ to $L^8$ are hydrogen atoms) and formaldehyde in the presence of a base catalyst. In the reaction, it is appropriate that the reaction temperature be kept at 60° C. or below in order to prevent resinification or gelation. More specifically, those compounds can be synthesized-using the methods disclosed in Japanese Patent Laid-Open Nos. 282067/1994 and 64285/1995.

Phenol derivatives having alkoxymethyl groups can be prepared by reaction between the corresponding hydroxymethyl groups-containing phenol derivatives and alcohol in the presence of an acid catalyst. In the reaction, it is appropriate that the reaction temperature be kept at 100° C. or below in order to prevent resinification or gelation. More specifically, those derivatives can be synthesized using the methods disclosed in EP-A1-632003.

The hydroxylmethyl groups- or alkoxymethyl groups-containing phenol derivatives synthesized in the aforementioned manners are favorable in respect of storage stability. In particular, alkoxymethyl groups-containing phenol derivatives are preferable from the viewpoint of storage stability.

The phenol derivatives containing hydroxymethyl or/and alkoxymethyl groups in the total number of at least two per molecule, wherein the hydroxylmethyl or/and alkoxymethyl groups may be converged on or allocated among at least some of the benzene rings, may be used alone or as a mixture of two or more thereof.

Besides the phenol derivatives, the following compounds (i) and compounds (ii) are usable as cross-linking agent:
  (i) Compounds having N-hydroxymethyl groups, N-alkoxymethyl groups or N-acyloxymethyl groups, and
  (ii) Epoxy compounds.

The cross-linking agent is used in a proportion of 3 to 65 weight %, preferably 5 to 50 weight %, to the total solids in the resist composition. This is because the cross-linking agent added in proportions lower than 3 weight % causes reduction in remaining film rate, and the addition in proportions higher than 65 weight % lowers the resolution, and besides, it is hardly appropriate from the viewpoint of resist solution stability upon storage.

In addition to the phenol derivatives as illustrated above, other cross-linking agents, such as the compounds (i) and the compounds (ii), can be used in combination.

The ratio of the phenol derivatives to the other cross-linking agents usable in combination therewith is from 100/0 to 20/80, preferably from 90/10 to 40/60, far preferably from 80/20 to 50/50, by mole.

The cross-linking agents for combined use are described in more detail.

Examples of Compound (i) having N-hydroxymethyl, N-alkoxymethyl or N-acyloxymethyl groups include the condensation products prepared from the monomers or oligomers disclosed in EP-A-0133216 and West German Patent Nos. 3,634,671 and 3,711,264, melamine and formaldehyde, the condensation products prepared from the monomers or oligomers disclosed in the documents cited above, urea and formaldehyde, and the benzoguanamine-formaldehyde condensates disclosed as the alkoxy-substituted compounds in EP-A-0212482.

Of such compounds, preferred examples include the derivatives of at least two free N-hydroxymethyl, N-alkoxymethyl or N-acyloxymethyl groups-containing melamine-formaldehyde condensates, especially N-alkoxymethyl derivatives.

Examples of Compound (ii) include at least one epoxy group-containing monomeric, dimeric, oligomeric and polymeric epoxy compounds. For instance, these compounds include the products obtained by reaction between bisphenol A and epichlorohydrin, and the products obtained by reaction between phenol-formaldehyde resins having low molecular weights and epichlorohydrin. In addition, the epoxy resins disclosed and used in U.S. Pat. No. 4,026,705 and British Patent No. 1,539,192 can be used as Compound (ii).

[3] Acid Generator of Component (C) Used in the Invention, Which is Represented by Formula (I) and Generates Acid When Irradiated with Actinic Rays or Radiation:

The acid generator used in the invention is a compound that is represented by the foregoing formula (I) and generates an acid when irradiated with actinic rays or radiation.

In formula (I), $R_1$ to $R_5$, which may be the same or different, each represent a hydrogen atom, a nitro group, a halogen atom, an alkyl group, an alkoxy group, an alkyloxycarbonyl group, an aryl group or an acylamino group, or at least two of $R_1$ to $R_5$ may be combined with each other to form a ring structure. Herein, each of the alkyl, alkoxy, alkyloxycarbonyl, aryl and acylamino groups includes both substituent-free and substituent-containing groups.

$Y_1$ and $Y_2$, which may be the same or different, each represent an alkyl group or an alkenyl group. Herein, the alkyl group and the alkenyl group each include both substituent-free and substituent-containing groups. Further, the alkyl group includes both the group containing an ether or sulfide linkage in the interior thereof and the group free of such a linkage.

When both $Y_1$ and $Y_2$ are alkyl groups, however, at least either $Y_1$ or $Y_2$ is an alkyl group containing a hydroxyl group, an ether linkage or a sulfide linkage, or each of the alkyl groups as $Y_1$ and $Y_2$ contains at least 2 carbon atoms, preferably 2 to 10 carbon atoms, far preferably 2 to 4 carbon atoms.

At least one of $R_1$ to $R_5$ and at least either $Y_1$ or $Y_2$ may be combined to form a ring.

At least one of $R_1$ to $R_5$ and at least either $R_6$ or $R_7$ may be combined to form a ring, too.

The present acid generator may have at least two structures represented by formula (I) by combining them via a linkage group at the site of any of $R_1$ to $R_7$ or either $Y_1$ or $Y_2$.

$X^-$ represents a non-nucleophilic anion.

The alkyl group and the alkyl moiety in the acylamino group represented by each of $R_1$ to $R_7$ is preferably a 1–10C alkyl group including linear, branched and cyclic ones, such as a methyl group, an ethyl group, a propyl group, a n-butyl group, a sec-butyl group, a t-butyl group, a cyclobutyl group, a pentyl group, a neopentyl group, a cyclopentyl group, a hexyl group, a cyclohexyl group, a heptyl group, an octyl group, a nonyl group and a decyl group.

The alkoxy group and the alkoxy moiety in the alkyloxycarbonyl group represented by each of $R_1$ to $R_5$ is preferably a 1–10C alkoxy group, with examples including a methoxy group, an ethoxy group, a propoxy group, a butoxy group, a pentyloxy group, a hexyloxy group, a cyclohexyloxy group, a heptyloxy group, an octyloxy group, a nonyloxy group and a decyloxy group.

The aryl group represented by each of $R_1$ to $R_7$ is preferably a 6–14C aryl group, with examples including a phenyl group, a tolyl group and a naphthyl group.

The halogen atom represented by each of $R_1$ to $R_5$ is, e.g., a fluorine atom, a chlorine atom, a bromine atom or an iodine atom.

The alkyl group represented by $Y_1$ and $Y_2$ each is appropriately a 1–20C alkyl group, with examples including linear, branched and cyclic alkyl groups, such as a methyl group, an ethyl group, a propyl group, an isopropyl group, a n-butyl group, an iso-butyl group, a t-butyl group, a n-hexyl group, a cyclohexyl group, an octyl group and a dodecyl group. Of these groups, the preferred are 3–20C alkyl groups including linear, branched and cyclic ones, such as a propyl group, an isopropyl group, a n-butyl group, an iso-butyl group, a t-butyl group, a n-hexyl group, a cyclohexyl group, an octyl group and a dodecyl group. In particular, 4–12C alkyl groups including linear, branched and cyclic ones, such as a n-butyl group, an iso-butyl group, a t-butyl group, a n-hexyl group, a cyclohexyl group, an octyl group and a dodecyl group, are advantageous.

The alkenyl group represented by $Y_1$ and $Y_2$ each is preferably a 2–6C alkenyl group, with examples including a vinyl group, a propenyl group, a butenyl group and a hexenyl group.

$Y_1$ and $Y_2$ may be combined to form a ring together with $S^+$. It is appropriate that the ring formed have an alicyclic structure, preferably a 5- or 6-membered alicyclic structure, particularly preferably a 5-membered alicyclic structure.

At least two of $R_1$ to $R_5$ may be combined to form a cyclic structure.

In this case, the group formed by combining at least two of $R_1$ to $R_5$ is preferably a 4–10C alkylene group, such as a butylene group, a pentylene group or a hexylene group.

Examples of substituents which may be present on the alkyl, alkoxy, alkoxycarbonyl, aryl, aralkyl or alkenyl group represented by each of $R_1$ to $R_5$, the alkyl or aryl group represented by $R_6$ and $R_7$ each, and the alkyl or alkenyl group represented by $Y_1$ and $Y_2$ each include a nitro group, a halogen atom, a carboxyl group, a hydroxyl group, an amino group, a cyano group, an alkoxy group (preferably containing 1 to 5 carbon atoms) and an alkylthio group (preferably containing 1 to 5 carbon atoms). With respect to the aryl group and the aralkyl group, alkyl groups (preferably containing 1 to 5 carbon atoms) can further be present thereon as substituents.

When $Y_1$ and $Y_2$ are both alkyl groups, the alkyl group as at least either $Y_1$ or $Y_2$ has a hydroxyl group, an ether linkage or a sulfide linkage, or each of the alkyl groups as both $Y_1$ and $Y_2$ contains at least two carbon atoms, preferably 2 to 10 carbon atoms, far preferably 2 to 4 carbon atoms.

When $Y_1$ and $Y_2$ form no ring structure but both are alkyl groups containing neither substituents nor linkage groups, each preferably contains 3 to 8 carbon atoms, far preferably 4 to 8 carbon atoms.

When $Y_1$ and $Y_2$ are combined to form a ring structure, it is appropriate that $Y_1$ and $Y_2$ each contain 2 to 6 carbon atoms, preferably 2 to 4 carbon atoms.

When $R_1$ to $R_5$ are each a group having a substituent, the group is preferably a substituted alkyl group.

The suitable total number of the carbon atoms contained in $R_1$ to $R_5$ is from 1 to 6, preferably 1 or 2. The case is also advantageous wherein all of $R_1$ to $R_5$ are hydrogen atoms.

When $R_6$ and $R_7$ are each a group having a substituent, the group is preferably a substituted alkyl group.

The suitable total number of the carbon atoms contained in $R_6$ and $R_7$ is from 1 to 10, preferably from 1 to 6, particularly preferably from 1 to 4. The case is also advantageous wherein both $R_6$ and $R_7$ are hydrogen atoms.

Examples of a non-nucleophilic anion as $X^-$ include a sulfonic acid anion, a carboxylic acid anion, a bis(alkylsulfonyl)imide anion and a tris(alkylsulfonyl)methyl anion.

The non-nucleophilic anion is an anion having significantly low capability of causing nucleophilic reaction and enabling the prevention of aging decomposition by intramolecular nucleophilic reaction. By this anion, the storage stability of the resist can be enhanced.

Examples of the sulfonic acid anion include alkylsulfonic acid anions, aryl sulfonic acid anions and camphor sulfonic acid anions.

Examples of the carboxylic acid anion include alkylcarboxylic acid anions, arylcarboxylic acid anions and aralkylcarboxylic acid anions.

The alkyl moieties in the alkylsulfonic acid anions are preferably 1–30C alkyl groups, with examples including a methyl group, an ethyl group, a propyl group, an isopropyl group, a n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

The aryl moieties in the arylsulfonic acid anions are preferably 6–14C aryl groups, with examples including a phenyl group, a tolyl group and a naphthyl group.

The alkyl moieties in the alkylsulfonic acid anions and the aryl moieties in the arylsulfonic acid anions may have substituents.

Examples of such substituents include halogen atoms, alkyl groups, alkoxy groups and alkylthio groups.

The halogen atoms include chlorine, bromine, fluorine and iodine atoms.

The alkyl groups are preferably 1–15C alkyl groups, with examples including a methyl group, an ethyl group, a propyl group, an isopropyl group, a n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group and an eicosyl group.

The alkoxy groups are preferably 1–5C alkoxy groups, with examples including a methoxy group, an ethoxy group, a propoxy group and a butoxy group.

The alkylthio groups are preferably 1–15C alkylthio groups, with examples including a methylthio group, a nethylthio group, a propylthio group, an isopropylthio group, a n-butylthio group, an isobutylthio group, a sec-butylthio group, a pentylthio group, a neopentylthio group, a hexylthio group, a heptylthio group, an octylthio group, a nonylthio group, a decylthio group, an undecylthio group, a dodecylthio group, a tridecylthio group, a tetradecylthio group, a pentadecylthio group, a hexadecylthio group, a heptadecylthio group, an octadecylthio group, a nonadecylthio group and an eicosylthio group. Additionally, these alkyl, alkoxy and alkylthio groups each may be substituted by halogen atoms (preferably fluorine atoms).

The alkyl moieties in the alkylcarboxylic acid anions include the same ones as the alkyl moieties in the alkylsulfonic acid anions.

The aryl moieties in the arylcarboxylic acid anions include the same ones as the aryl moieties in the arylsulfonic acid anions.

The aralkyl moieties in the aralkylcarboxylic acid anions are preferably 6–12C aralkyl groups, with examples including a benzyl group, a phenetyl group, a naphthylmethyl group and a naphthylethyl group.

The alkyl moiety, the aryl moiety and the aralkyl moiety in the alkylcarboxylic acid anion, the arylcarboxylic acid anion and the aralkylcarboxylic acid anion respectively may have substituents. Examples of such substituents include the same halogen atoms, alkyl groups, alkoxy groups and alkylthio groups as in the arylsulfonic acid anions.

The alkyl moieties in the bis(alkylsulfonyl)imide anions and the tris(alkylsulfonyl)methyl anions are preferably 1–5C alkyl groups, with examples including a methyl group, an ethyl group, a propyl group, an isopropyl group, a n-butyl group, an isobutyl group, a sec-butyl group, a pentyl group and a neopentyl group. These alkyl groups may have substituents. Examples of such substituents include halogen atoms, alkoxy groups and alkylthio groups.

Examples of other non-nucleophilic anions include phosphorus fluoride, boron fluoride and antimony fluoride.

As the non-nucleophilic anion of $X^-$, sulfonic acid anion containing a fluorine atom, further 1-fluorineated sulfonic acid anion, especially perfluoroalkanesulfonic acid anion, are preferred.

Other non-nucleophilic anions preferred as $X^-$ are benzenesulfonic acids substituted by fluorine atoms or fluorine-containing substituents.

In formula (I), at least one of $R_1$ to $R_5$ and at least either $Y_1$ and $Y_2$ may be combined to form a ring, or at least one of $R_1$ to $R_5$ and at least either $R_6$ or $R_7$ may be combined to form a ring.

In these cases, the group formed by combining at least one of $R_1$ to $R_5$ and at least either $Y_1$ or $Y_2$ and the group formed by combining at least one of $R_1$ to $R_5$ and at least either $R_6$ or $R_7$ are preferably 2–10C alkylene groups, with examples including an ethylene group, a propylene group, a butylene group, a pentylene group and a hexylene group.

The compound of formula (I) can have a fixed steric structure by ring formation to result in enhancement of light decomposition.

Also, the present acid generator may have at least two structures of formula (I) combined via a linkage group at the site of any of $R_1$ to $R_7$ or either $Y_1$ or $Y_2$.

In formula (I), it is appropriate that $R_1$ to $R_7$ each be a hydrogen atom or an alkyl group, and besides, $Y_1$ and $Y_2$ each be an alkyl group. The alkyl groups represented by $Y_1$ and $Y_2$, though they includes those forming a ring structure by being combined with each other and those forming no ring structure, are preferably those forming a ring structure.

Further, it is preferable that four to seven hydrogen atoms, especially six or seven hydrogen atoms, be contained in the whole of $R_1$ to $R_7$.

More specifically, preferred embodiments of the compound represented by formula (I) are as follows:

(a) A compound of formula (I) in which each of $R_1$ to $R_7$ is a hydrogen atom and each of $Y_1$ and $Y_2$ is an alkyl group.

(b) A compound of formula (I) in which $R_1$ to $R_5$ and $R_7$ are each a hydrogen atom, $R_6$ is an alkyl group and each of $Y_1$ and $Y_2$ is an alkyl group.

(c) A compound of formula (I) in which $R_1$, $R_2$, $R_4$ and $R_5$ are each a hydrogen atom, $R_3$ is an alkyl group and each of $Y_1$ and $Y_2$ is an alkyl group.

(d) A compound of formula (I) in which one of $R_1$ to $R_5$ is an alkyl group, the others are hydrogen atoms, each of $R_6$ and $R_7$ is a hydrogen atom and each of $Y_1$ and $Y_2$ is an alkyl group.

(e) A compound of formula (I) in which each of $R_1$ to $R_5$ is a hydrogen atom, each of $R_6$ and $R_7$ is an alkyl group and each of $Y_1$ and $Y_2$ is an alkyl group.

In the compounds (a) to (e), the alkyl groups represented by $Y_1$ and $Y_2$, though they includes those forming a ring structure by being combined with each other and those forming no ring structure, are preferably those forming a ring structure.

Suitable examples of the present compound represented by formula (I) are illustrated below, but these examples should not be construed as limiting the scope of the invention in any way.

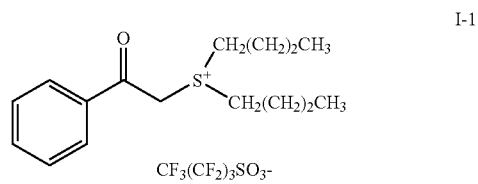

I-1

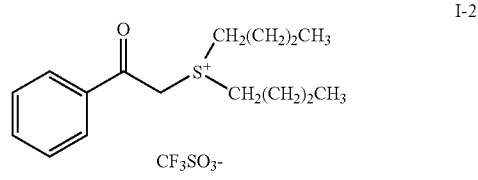

I-2

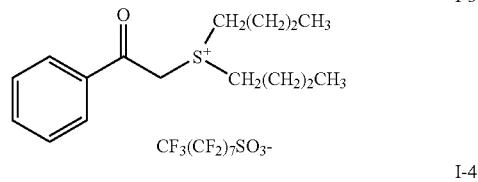

I-3

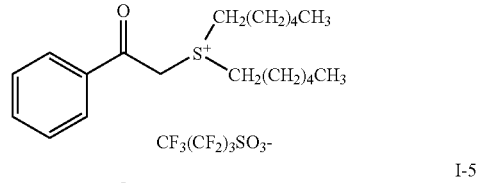

I-4

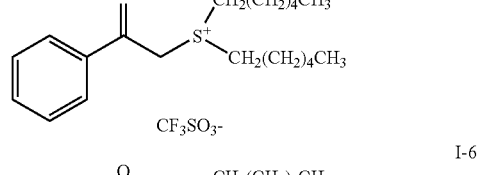

I-5

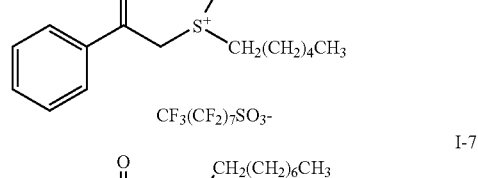

I-6

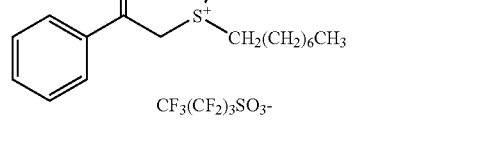

I-7

-continued

I-8: phenacyl sulfonium with two -CH₂(CH₂)₆CH₃ groups; CF₃SO₃⁻

I-9: phenacyl sulfonium with two -CH₂(CH₂)₆CH₃ groups; CF₃(CF₂)₇SO₃⁻

I-10: phenacyl sulfonium with two -CH₂(CH₂)₁₀CH₃ groups; CF₃(CF₂)₃SO₃⁻

I-11: phenacyl sulfonium with two -CH₂(CH₂)₁₀CH₃ groups; CF₃SO₃⁻

I-12: phenacyl sulfonium with two -CH₂(CH₂)₁₀CH₃ groups; CF₃(CF₂)₇SO₃⁻

I-13: phenacyl sulfonium with two -CH₂CH₂OH groups; CF₃(CF₂)₃SO₃⁻

I-14: phenacyl sulfonium with two -CH₂CH₂OH groups; CF₃SO₃⁻

I-15: phenacyl sulfonium with two -CH₂CH₂OH groups; CF₃(CF₂)₇SO₃⁻

I-16: phenacyl sulfonium with two sec-butyl groups; CF₃(CF₂)₃SO₃⁻

I-17: phenacyl sulfonium with two sec-butyl groups; CF₃SO₃⁻

I-18: phenacyl sulfonium with two sec-butyl groups; CF₃(CF₂)₇SO₃⁻

I-19: phenacyl sulfonium with two isopropyl groups; CF₃(CF₂)₃SO₃⁻

I-20: phenacyl sulfonium with two isopropyl groups; CF₃SO₃⁻

I-21: phenacyl sulfonium with two isopropyl groups; CF₃(CF₂)₇SO₃⁻

I-22: phenacyl sulfonium with two tert-butyl groups; CF₃(CF₂)₃SO₃⁻

I-23: phenacyl sulfonium with two tert-butyl groups; CF₃SO₃⁻

I-24: phenacyl sulfonium with two tert-butyl groups; CF₃(CF₂)₇SO₃⁻

-continued

I-25: Phenacyl diallyl sulfonium, CF$_3$(CF$_2$)$_3$SO$_3^-$

I-26: Phenacyl diallyl sulfonium, CF$_3$SO$_3^-$

I-27: Phenacyl diallyl sulfonium, CF$_3$(CF$_2$)$_7$SO$_3^-$

I-28: Phenacyl (2-hydroxyethyl)(methyl)sulfonium, CF$_3$(CF$_2$)$_3$SO$_3^-$

I-29: Phenacyl (2-hydroxyethyl)(methyl)sulfonium, CF$_3$SO$_3^-$

I-30: Phenacyl (2-hydroxyethyl)(methyl)sulfonium, CF$_3$(CF$_2$)$_7$SO$_3^-$

I-31: Phenacyl ethyl(2-hydroxyethyl)sulfonium, CF$_3$(CF$_2$)$_3$SO$_3^-$

I-32: Phenacyl ethyl(2-hydroxyethyl)sulfonium, CF$_3$SO$_3^-$

I-33: Phenacyl ethyl(2-hydroxyethyl)sulfonium, CF$_3$(CF$_2$)$_7$SO$_3^-$

I-34: Phenacyl sec-butyl(methyl)... (2-hydroxyethyl), CF$_3$(CF$_2$)$_3$SO$_3^-$

I-35: CF$_3$SO$_3^-$

I-36: CF$_3$(CF$_2$)$_7$SO$_3^-$

I-37: Phenacyl bis(3-hydroxypropyl)sulfonium, CF$_3$(CF$_2$)$_3$SO$_3^-$

I-38: CF$_3$SO$_3^-$

I-39: CF$_3$(CF$_2$)$_7$SO$_3^-$

I-40: Phenacyl (3-hydroxypropyl)(methyl)sulfonium, CF$_3$(CF$_2$)$_3$SO$_3^-$

I-41: Phenacyl (3-hydroxypropyl)(methyl)sulfonium, CF$_3$SO$_3^-$

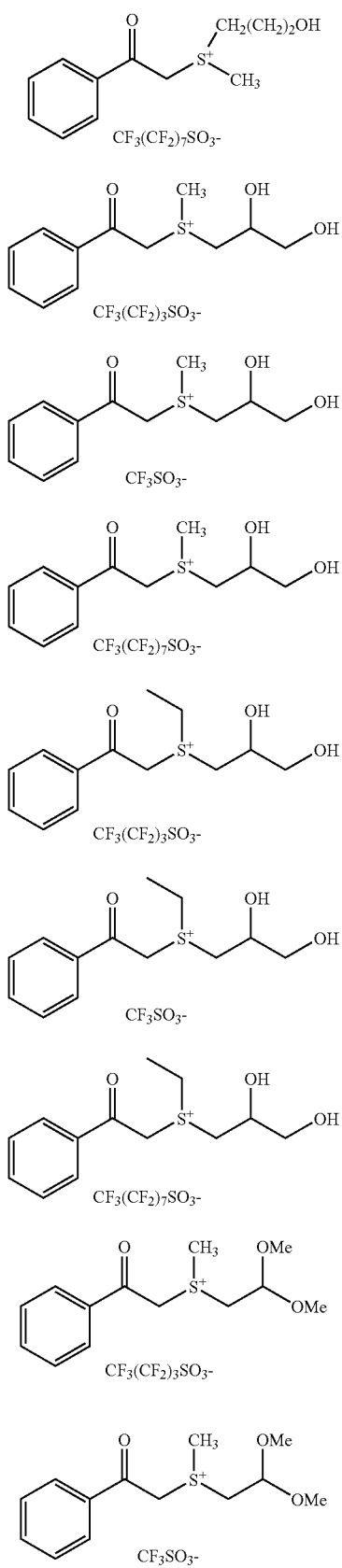
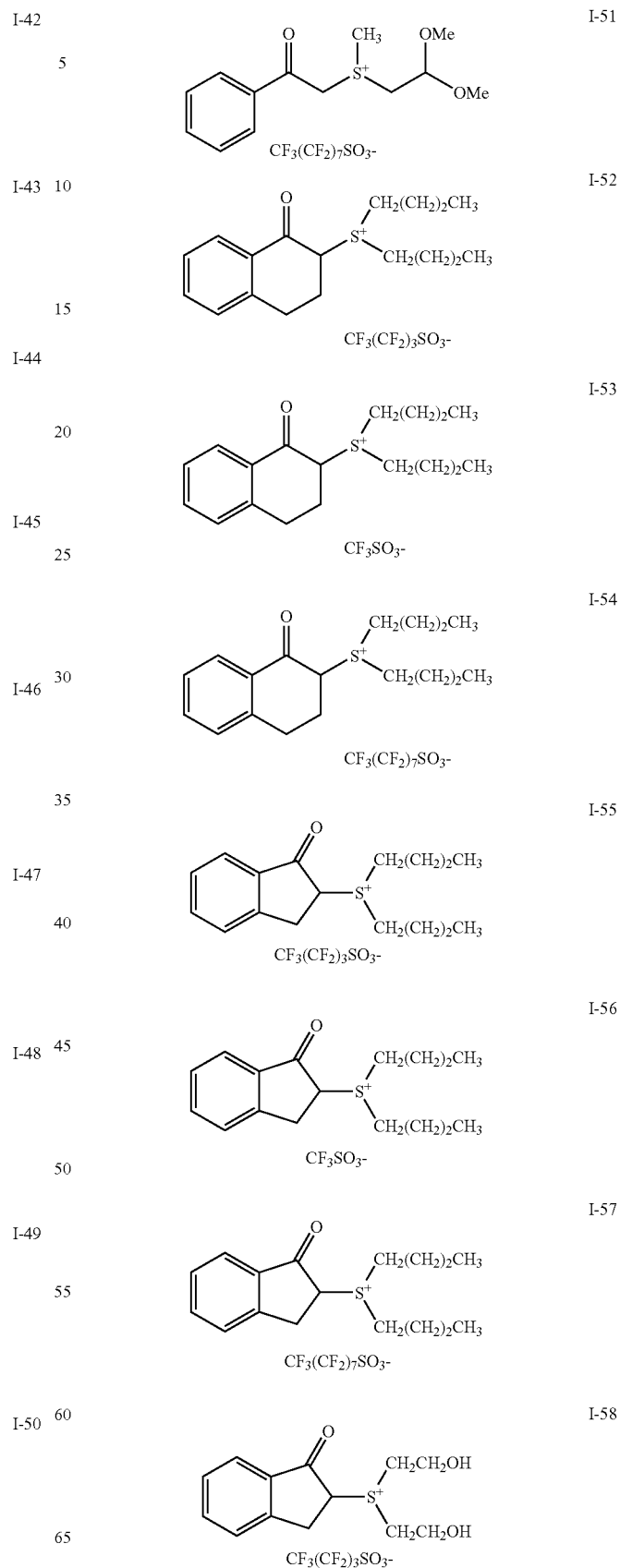

-continued
I-59
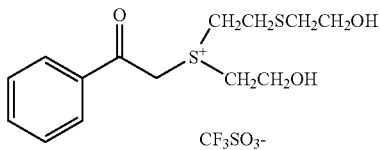
CF$_3$SO$_3$-
I-60
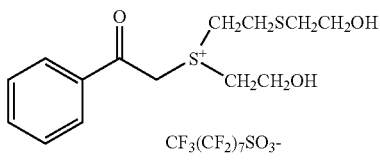
CF$_3$(CF$_2$)$_7$SO$_3$-
I-61
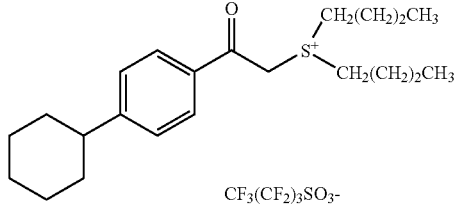
CF$_3$(CF$_2$)$_3$SO$_3$-
I-62
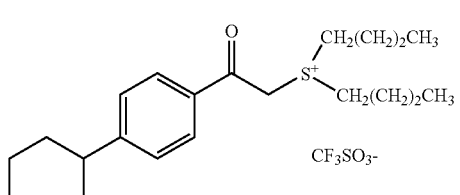
CF$_3$SO$_3$-
I-63
I-64
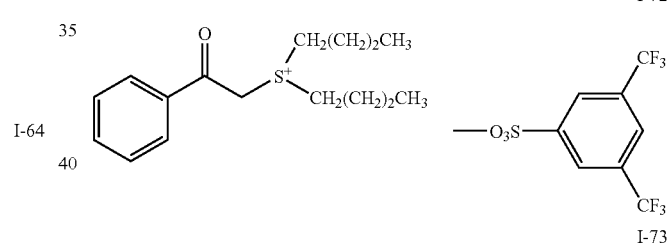
I-65
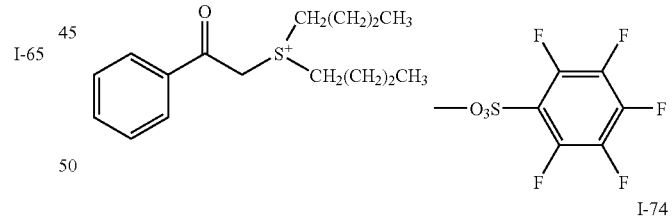
I-66
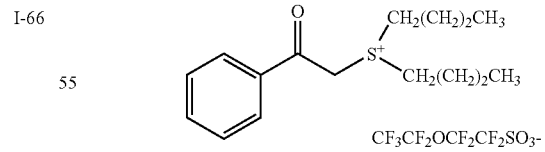
CF$_3$CF$_2$OCF$_2$CF$_2$SO$_3$-
I-67
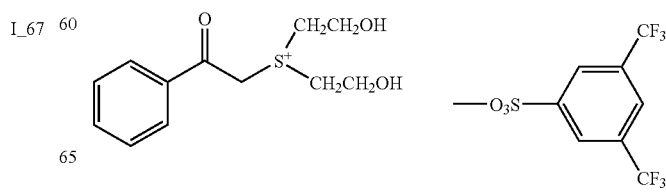
-continued
I-68
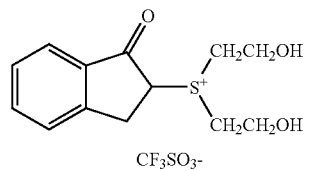
CF$_3$SO$_3$-
I-69
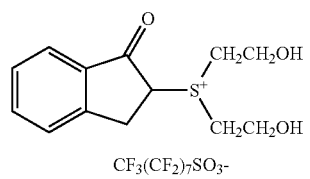
CF$_3$(CF$_2$)$_7$SO$_3$-
I-70
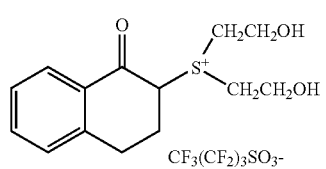
CF$_3$(CF$_2$)$_3$SO$_3$-
I-71
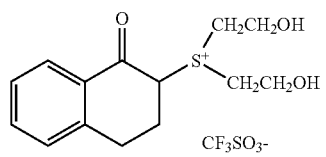
CF$_3$SO$_3$-
I-72
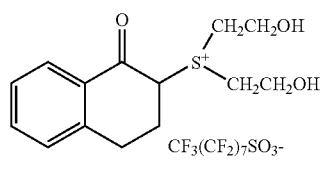
I-73
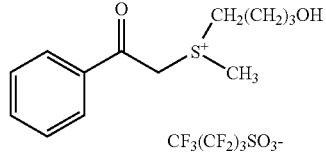
I-74
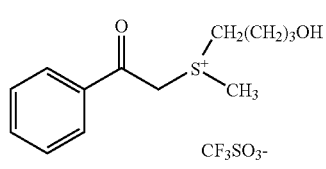
I-75
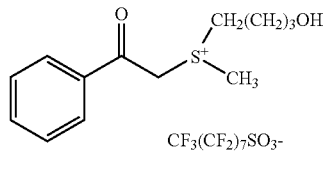

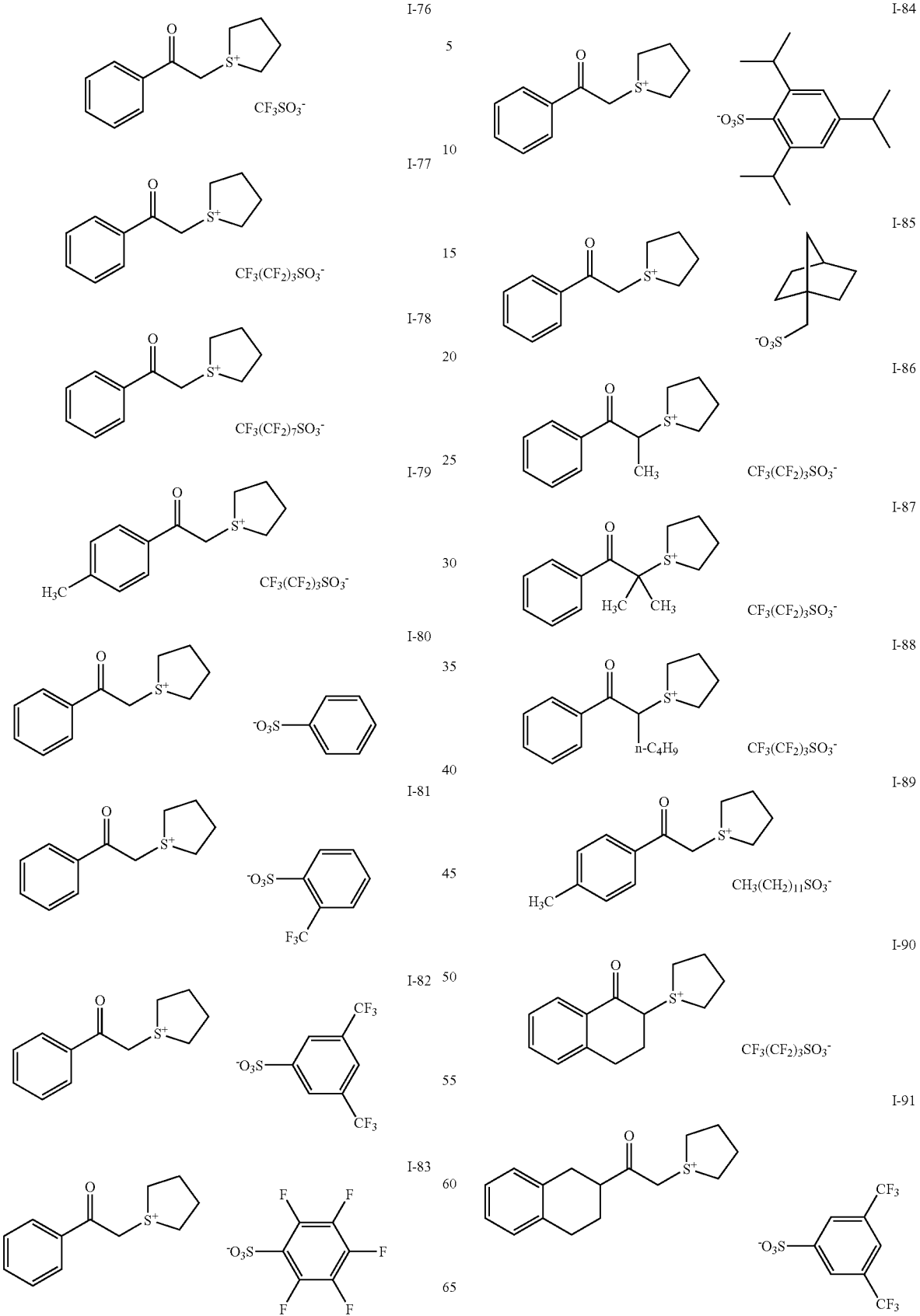

-continued

I-92
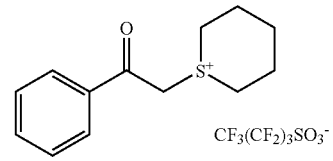

I-93
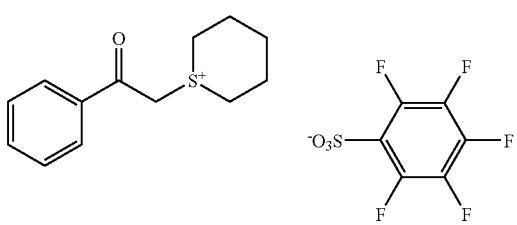

I-94
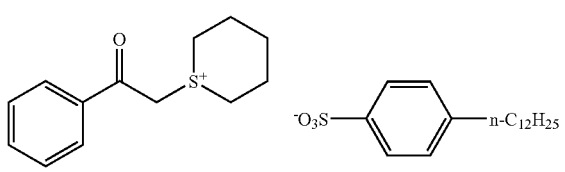

I-95
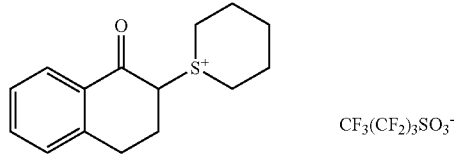

I-96
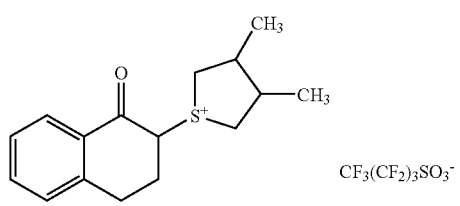

I-97

I-98
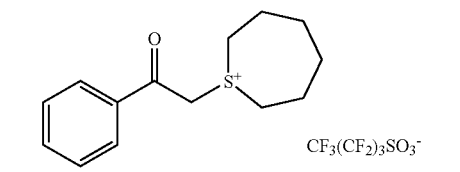

The compounds of formula (I) as illustrated above can be used alone or as combinations of two or more thereof.

The compounds represented by formula (I) can be prepared in a manner that phenacyl halogenide derivatives, such as phenacyl bromide, are made to react with sulfides in solvents appropriate thereto respectively without using any catalyst or in the presence of a silver catalyst, thereby forming phenacyl dialkylsulfonium salts, and then these salts undergo salt exchanges with the intended anions.

The suitable proportion of the compound(s) of Component (C) in the present negative resist composition is from 0.1 to 20 weight %, preferably from 0.5 to 10 weight %, far preferably from 1 to 7 weight %, based on the total solids in the composition.

Acid-Generating Compounds Usable in Combination with Component (C):

In addition to the acid generator(s) of Component (C), compounds capable of generating acids by decomposition under irradiation with actinic rays or radiation (or photo-acid generators) may further be used in the invention.

The present Component (C) and other photo-acid generators usable in combination therewith are used at ratios ranging generally from 100/0 to 20/80, preferably from 100/0 to 40/60, far preferably from 100/0 to 50/50, by mole.

Such photo-acid generators usable in combination can be selected appropriately from photo-initiators for cationic photo-polymerization, photo-initiators for radical photo-polymerization, photo-decoloring agents for dyes, photo-discoloring agents, known compounds capable of generating acids by irradiation with actinic rays or radiation as used for microresists, or mixtures of two or more thereof.

More specifically, they can be selected from diazonium salts, phosphonium salts, sulfonium salts, iodonium salts, imide sulfonates, oxime sulfonates, diazosulfones, disulfones or o-nitrobenzylsulfonates.

Further, polymeric compounds having main or side chains into which groups or compounds capable of generating acids when irradiated with actinic rays or radiation are introduced are also usable. Examples of such polymeric compounds include the compounds disclosed in U.S. Pat. No. 3,849,137, German Patent No. 3,914,407, and Japanese Patent Laid-Open Nos. 26653/1988, 164824/1980, 69263/1987, 146038/1988, 163452/1988, 153853/1987 and 146029/1988.

In addition, the compounds capable of generating acids by the action of light as disclosed in U.S. Pat. No. 3,779,778 and European Patent No. 126,712 are also usable.

The compounds illustrated below are examples of compounds preferred in particular as those which can generate acids by decomposition under irradiation with actinic rays or radiation and may be used in combination with Component (C).

(z1)
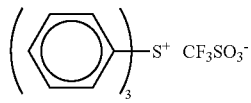

(z2)
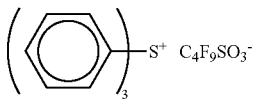

-continued
(z3) 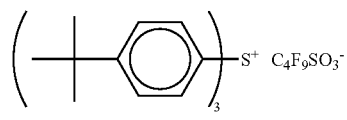
(z4) 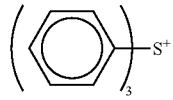 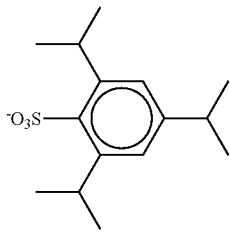
(z5) 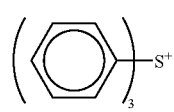 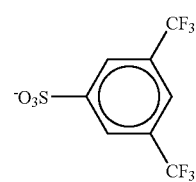
(z6) 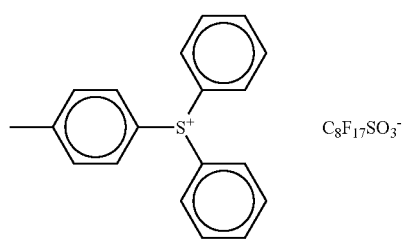
(z7) 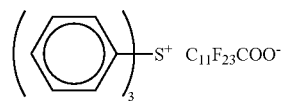
(z8) 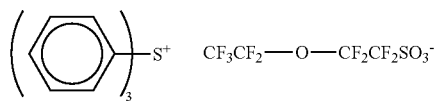
(z9) 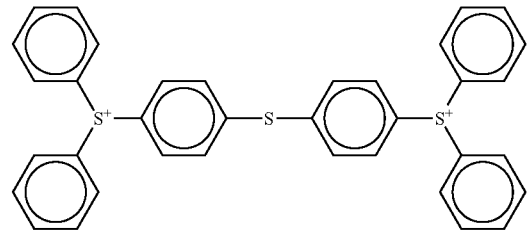 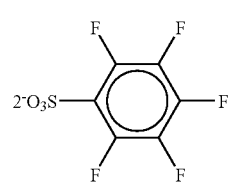
(z10) 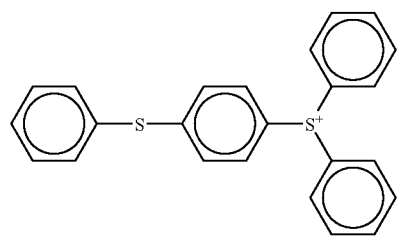
(z11) 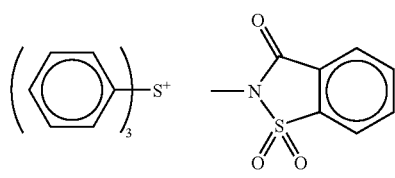
(z12) 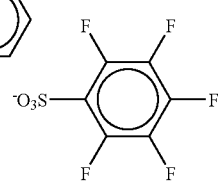
(z13) 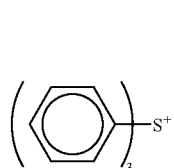 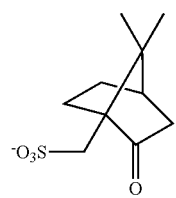 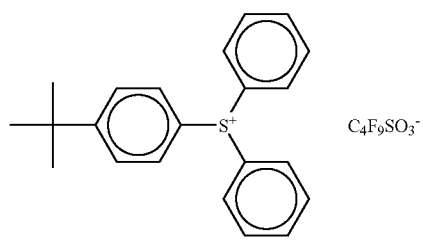

-continued
(z14)
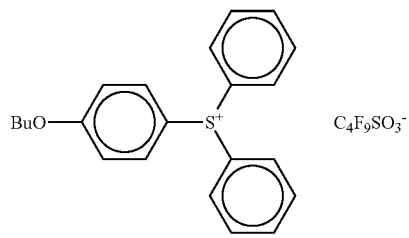
(z15)
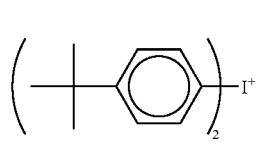 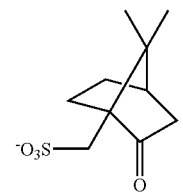
(z16)
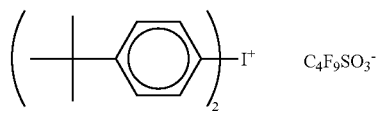
(z17)
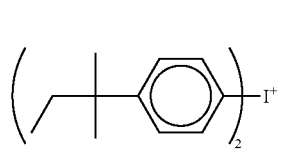 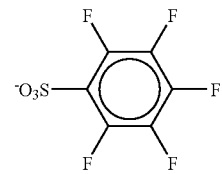
(z18)
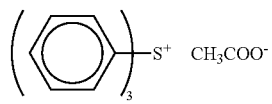
(z19)
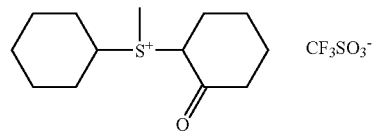
(z20)
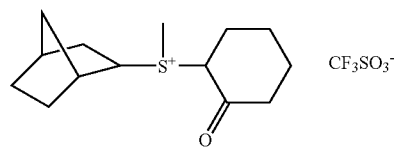
(z21)
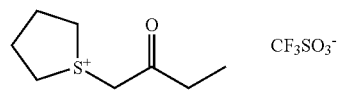
(z22)
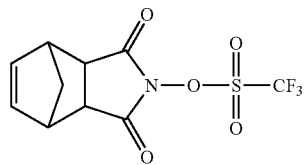
(z23)
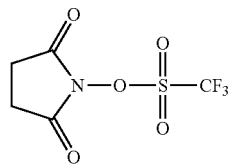
(z24)
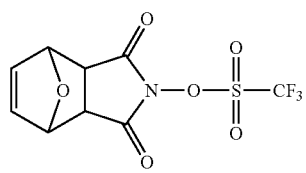
(z25)
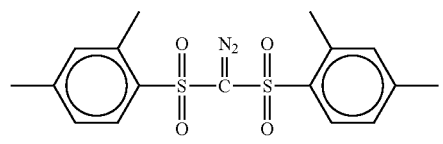
(z26)
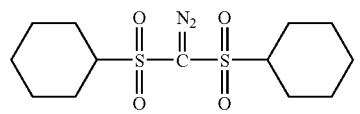
(z27)
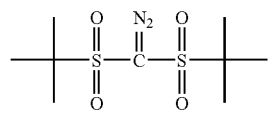
(z28)
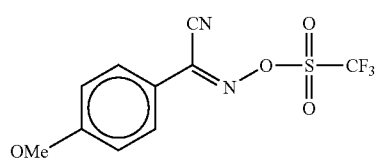

-continued

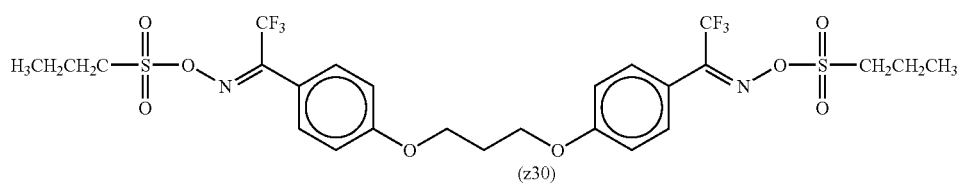
(z29)

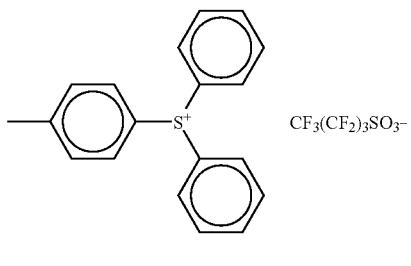
(z30)

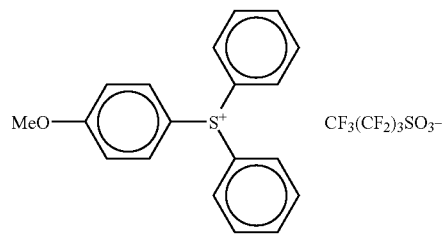
(z31)

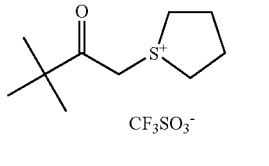
(z32)

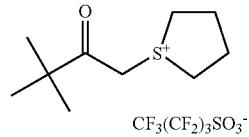
(z33)

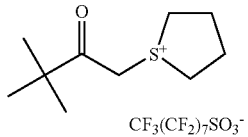
(z34)

(z35)

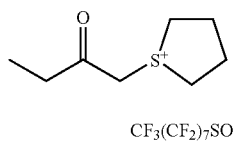

(z39)

[4] Other Components Used in Present Composition:

The present negative resist composition can further contain nitrogen-containing basic compounds, dyes, surfactants, plasticizers, photo-decomposable base compounds and photo-base generators, if needed.

[4]-1 Nitrogen-Containing Basic Compounds (Component (D))

Nitrogen-containing basic compounds which can be used appropriately in the invention are compounds stronger in basicity than phenol.

Examples of preferred chemical environments of the nitrogen(s) in such compounds include the following structures of formulae (A) to (E). Each of the formulae (B) to (E) may be part of a ring structure.

(A)

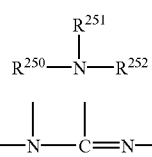

(B)

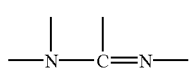

(C)

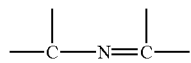

(D)

(E)

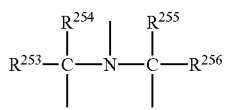

In the above formula (A), $R^{250}$, $R^{251}$ and $R^{252}$, which may be the same or different, independently represent a hydrogen atom, a 1–6C alkyl group, a 1–6C aminoalkyl group, a 1–6C hydroxyalkyl group, or a substituted or unsubstituted 6–20C aryl group. Further, $R^{251}$ and $R^{252}$ may be combined with each other to form a ring.

In the formula (E), $R^{253}$, $R^{254}$, $R^{255}$ and $R_{256}$, which may be the same or different, independently represent a 1–6C alkyl group.

More suitable compounds are nitrogen-containing basic compounds which each have at least two nitrogen atoms of different chemical environments. And the compounds preferred in particular are compounds which each contain both substituted or unsubstituted amino group and nitrogen-containing ring structure, or compounds containing alkylamino groups.

Suitable examples of such compounds include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a subsituted or unsubstituted piperazine, a subsituted or unsubstituted aminomorpholine, and a substituted or unsubstituted aminoalkylmotpholine. Examples of substituents appropriate to the above-recited compounds include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Examples of compounds preferred in particular include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine. However, compounds especially preferred in the invention should not be construed as being limited to the compounds recited above.

Those nitrogen-containing basic compounds can be used alone or as mixtures of two or more thereof.

The appropriate ratio between acid generators and nitrogen-containing basic compounds used in the composition is from 2.5 to 300 by mole. When the ratio is smaller than 2.5 by mole, the composition may have low sensitivity and low resolution; while, when the ratio is larger than 300 by mole, the resist pattern thickening may increase during the period from exposure to heat treatment to lower the resolution. The acid generator/nitrogen-containing basic compound ratio is preferably from 5.0 to 200, far preferably from 7.0 to 150, by mole.

[4]-2 Dyes

The suitable dyes include oil-soluble dyes and basic dyes. Examples of such dyes include Oil Yellow #101, Oil Yellow #103, Oil Pink #312, Oil Green BG, Oil Blue BOS, Oil Blue #603, Oil Black BY, Oil Black BS, Oil Black T-505 (which are products of Orient Chemical Industry Co., Ltd.), Crystal Violet (CI42555), Methyl Violet (CI42535), Rhodamine B (CI145170B), Malachite Green (CI42000) and Methylene Blue (CI52015).

[4]-3 Solvents

The present composition is dissolved in a solvent capable of dissolving the ingredients as mentioned above, and coated on a substrate. Examples of a solvent suitably used herein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycolmonoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone, and tetrahydrofuran. These solvents are used alone or as mixtures.

[4]-4 Surfactants

Surfactants can be added to the solvents as recited above. Examples of surfactants usable herein include nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenol ether, polyoxyethylene nonyl phenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylenesorbitan fatty acid esters (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate), fluorine-containing surfactants and silicon-containing surfactants, such as Eftop EF301, EF303 and EF352 (produced by Shin-Akita Kasei K.K.), Megafac F171 and F173 (produced by Dainippon Ink & Chemicals, Inc.), Florad FC430 and FC431 (produced by Sumitomo 3M, Inc.), Asahi-Gard AG710, Surflon S-382, SC101, SC102, SC103, SC104, SC105 and SC106 (produced by Asahi Glass Co., Ltd.) and Troysol S-366 (produced by Troy Chemical Industries, Inc.), organosiloxane polymer KP-341 (produced by Shin-Etsu Chemical Industry Co., Ltd.), and acrylic or methacrylic acid-based (co)polymers, such as Polyflow No. 75 and No. 95 (produced by Kyoei-Sha Yushi Kagaku Kogyo K.K.). These surfactants are mixed in the present composition in an amount of generally 2 parts by weight or below, preferably 1 parts by weight or below, per 100 parts by weight of solids in the composition.

The surfactants as recited above may be added alone or some of them can be added in combination.

[4]-5 Plasticizers

Examples of plasticizers usable in the present negative resist composition include the compounds as disclosed in Japanese Patent Laid-Open Nos. 212960/1992 and 262720/1996, European Patent Nos. 735422, 416873 and 439371, and U.S. Pat. No. 5,846,690, specifically di(2-ethylhexyl) adipate, n-hexyl benzoate, di-n-octyl phthalate, di-n-butyl phthalate, benzyl-n-butyl phthalate and dihydroabiethyl phthalate.

[4]-6 Photo-Decomposable Basic Compounds

To the present composition, the ammonium salts disclosed in Japanese Patent Laid-Open No. 28247/1995, European Patent No.616258, U.S. Pat. No. 5,525,443, Japanese Patent Laid-Open No. 127700/1997, European Patent No. 762207 and U.S. Pat. No. 5,783,354, such as tetramethylammonium hydroxide, tetra-n-butylammonium hydroxide and betaine, can further be added. Thereto, it is also possible to add the compound scausing reduction in basicity when exposed to light (photo bases) as disclosed in Japanese Patent Laid-Open Nos. 232706/1993, 11835/1994, 242606/1994, 266100/1994, 333851/1995 and 333844/1995, U.S. Pat. No. 5,663,035 and European Patent No. 677788.

[4]-7 Photo-base Generators

To the present composition, the compounds disclosed in Japanese Patent Laid-Open Nos. 151156/1992, 162040/1992, 197148/1993, 5995/1993, 194834/1994, 146608/1996 and 83079/1998, and European Patent No. 622682 can be added as photo-base generators. More specifically, 2-nitrobenzyl carbamate, 2,5-dinitrobenzylcyclohexyl carbamate, N-cyclohexyl-4-methylphenylsulfonamide and 1,1-dimethyl-2-phenylethyl-N-isopropyl carbamate can be preferably used. These photo-base generators are added for the purpose of improving resist profiles.

The present negative resist composition is coated on a substrate and forms a thin film. The suitable thickness of the coating film is from 0.1 to 4.0 μm.

In the invention, a commercially available inorganic or organic antireflective film can be used, if needed. And it is also possible to use an antireflective coating as an upper layer of the resist coating.

Both an inorganic type of antireflective coating formed of titanium, titanium dioxide, titanium nitride, chromium oxide, carbon or amorphous silicon and an organic type of antireflective coating made up of a light absorbent/polymer material combination can be used as a lower layer of the resist coating. For the coating formation, the coating of the former type requires equipment, such as a vacuum evaporator, CVD apparatus or sputtering apparatus. Examples of such an antireflective coating of organic type include the coating disclosed in Japanese Patent Publication No. 69611/1995, which is made up of a condensation product of a diphenylamine derivative and a formaldehyde-modified melamine resin, an alkali-soluble resin and a light absorbent; the coating disclosed in U.S. Pat. No. 5,294,680, which is made up of the reaction product of a maleic anhydride copolymer and a light absorbent of diamine type; the coating disclosed in Japanese Patent Laid-Open No. 118631/1994, which contains a resin binder and a thermal cross-linking agent of methylolmelamine type; the coating disclosed in Japanese Patent Laid-Open No. 118656/1994, which is made up of an acrylic resin containing carboxylic, epoxy and light-absorbing groups in every molecule; the coating disclosed in Japanese Patent Laid-Open No. 87115/1996, which is made up of methylolmelaine and a light absorbent of benzophenone type; and the coating disclosed in Japanese Patent Laid-Open No. 179509/1996, which is made up of a low molecular light absorbent-added polyvinyl alcohol resin.

In addition, commercially available organic antireflective films, such as DUV 30 series, DUV-40 series produced by Brewer Science Inc. and AR-2, AR-3 and AR-5 produced by Shipley Inc., can also be used as organic antireflective coatings.

In fabrication of highly precise integrated circuit devices, pattern formation on the resist coating can be performed in the following process: The present negative resist composition is coated on a substrate (e.g., silicon/silicon dioxide coating, a glass substrate, a metal substrate) directly or an antireflective coating as recited above, which is formed in advance on a substrate, and then the resist coating thus formed is irradiated with an excimer laser, electron-beam or X-ray drawing apparatus, and further subjected sequentially to baking, development, rinsing and drying treatment. Thus, resist patterns of good quality can be obtained. In the irradiation, the apparatus using electron beams or X-rays as a light source is preferably used.

Developers usable for the present negative resist composition are aqueous solutions containing inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide and choline, or cyclic amines such as pyrrole and piperidine. To the aqueous solutions of alkalis, alcohol and surfactants may further be added in appropriate amounts.

Of those developers, aqueous solutions containing quaternary ammonium salts, especially tetramethylammonium hydroxide and choline, are preferred over the others.

The invention will now be illustrated in more detail by reference to the following examples, but these examples should not be construed as limiting the scope of the invention in any way.

1. SYNTHESIS EXAMPLES OF CONSTITUENT MATERIALS

<(1) Alkali-Soluble Polymers of Component (A)>

Synthesis Example 1

Synthesis of Resin (29)

In 30 ml of 1-methoxy-2-propanol were dissolved 3.9 g (0.024 mole) of 4-acetoxystyrene and 0.8 g (0.006 mole) of 4-methoxystyrene. While keeping this solution at 70° C. with stirring in a stream of nitrogen, thereto was added dropwise a solution containing 50 mg of 2,2'-azobis(2,4-dimethylvaleronitrile) as a polymerization initiator (V-65, trade name, a product of Wako Pure Chemical Industries, Ltd.), 9.1 g (0.056 mole) of 4-acetoxystyrene and 1.9 g (0.014 mole) of 4-methoxystyrene in 70 ml of 1-methoxy-2-propanol. On this addition, 2 hours were spent. Thereafter, the admixture was heated up to 90° C. and the stirring thereof was continued for additional 1 hour. After cooling, the reaction solution was poured into 1 liter of ion exchange water with vigorous stirring, thereby depositing a white resin. The resin obtained was dried, and then dissolved in 100 ml of methanol. Thereto, 25% tetramethylammonium hydroxide was added to hydrolyze acetoxy groups in the resin. The hydrolyzed solution was neutralized with an aqueous solution of hydrochloric acid to deposit a white resin. The resin was washed with ion exchange water, and dried under reduced pressure. Thus, 11.6 g of the intended Resin (29) was obtained. In the molecular weight measurement of Resin (29) by GPC, the weight average molecular weight (Mw) was found to be 9,200 in polystyrene terms and the dispersion degree (MW/Mn) was found to be 2.2.

In similar manners to the above, resins of the present Component (A) were synthesized.

<(2) Cross-Linking Agent of Component (B)>

Synthesis of [HM-1]:

To a 10% aqueous solution of potassium hydroxide, 20 g of 1-[α-methyl-α'-(4-hydroxyphenyl)ethyl]-4-[α,α-bis(4-hydrox yphenyl)ethyl]benzene (Trisp-PA, trade name, a product of HONSHU CHEMICAL INDUSTRY CO., LTD.) was added, and made into a solution by stirring. While continuing to stir the solution, thereto was added gradually 60 ml of a 37% aqueous solution of formaldehyde over a period of one hour. Further, the stirring was continued for 6 hours. Thereafter, the reaction solution was poured into a dilute aqueous solution of sulfuric acid. The precipitates thus obtained were filtered off, washed thoroughly with water, and gave 20 g of a white powder by recrystallization from 30 ml of methanol. This white powder was a hydroxylmethyl-containing phenol derivative [HM-1] represented by the following structural formula, and the purity thereof was found to be 92% (by liquid chromatography).

[HM-1]

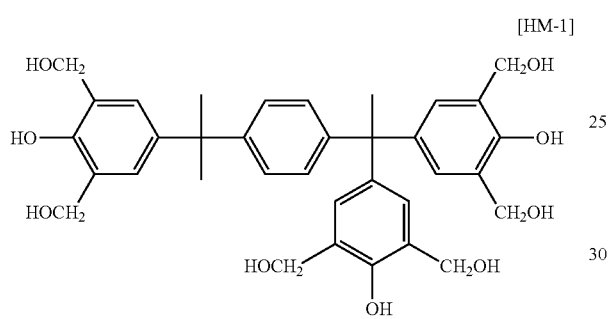

Synthesis of [MM-1]

To 1 liter of methanol, 20 g of the hydroxymethyl-containing phenol derivative [HM-1] obtained in the foregoing synthesis example was added and made into a solution by stirring under heating. To this solution, 1 ml of concentrated sulfuric acid was added, and heated under reflex for 12 hours. At the conclusion of the reaction, the reaction solution was cooled, and thereto 2 g of potassium carbonate was added. The admixture was thoroughly concentrated, and thereto 300 ml of ethyl acetate was added. This solution was washed with water, and then concentrated and evaporated to dryness. Thus, 22 g of a white solid identified as the methoxymethyl-containing phenol derivative [MM-1] having the structure illustrated below was obtained. The purity of this solid was found to be 90% (by liquid chromatography).

[MM-1]

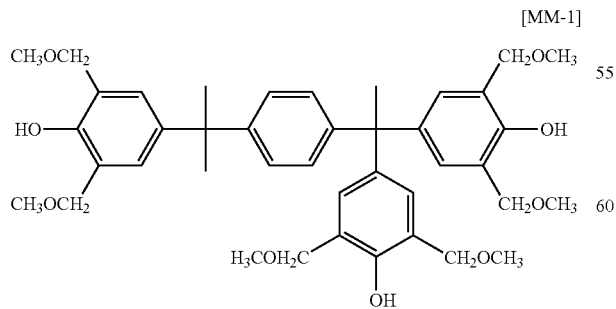

In similar manners to the above, the phenol derivatives illustrated below were synthesized.

[HM-2]

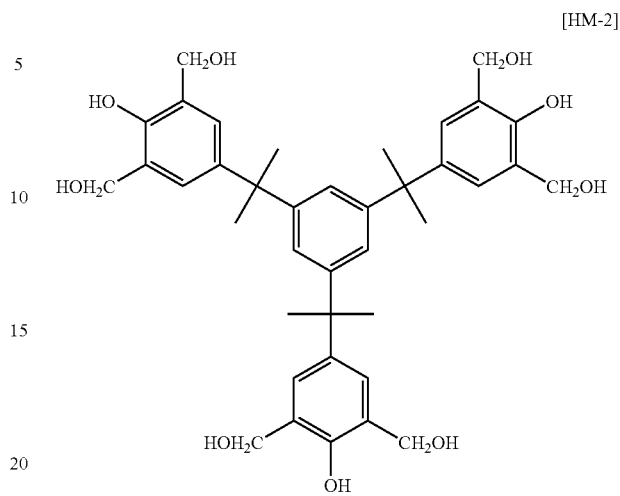

[MM-2]

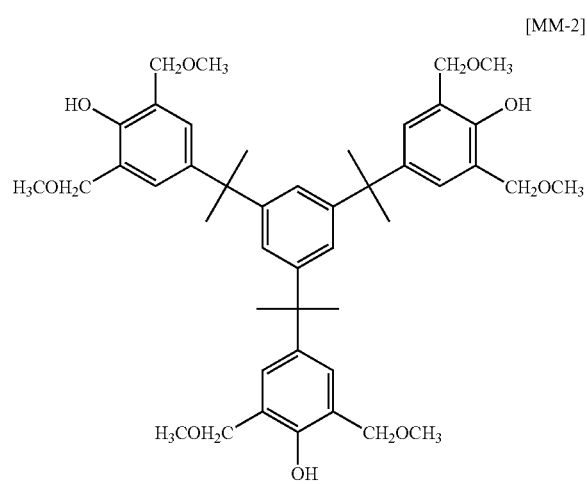

[HM-3]

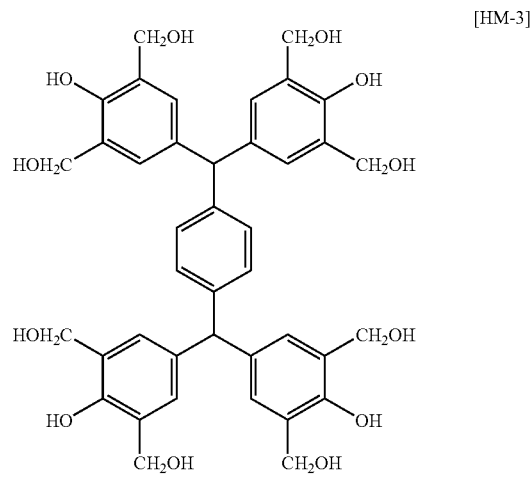

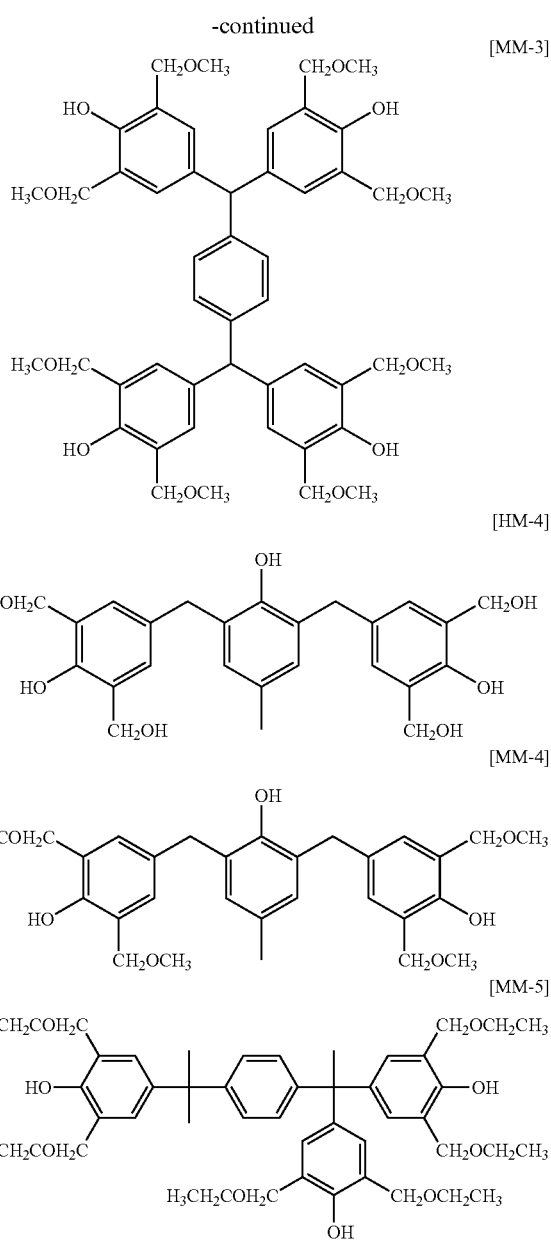

<(3) Acid-Generator of Component (C)>

Synthesis Example 1

Synthesis of Acid-Generator (1-1)

To a mixture of 16.4 g of AgBF$_4$ with 150 ml of acetonitrile, a solution containing 16.0 g of phenacyl bromide and 12.4 g of di-n-butyl sulfide in 50 ml of acetonitrile was added over a period of 30 minutes. After stirring for one night at room temperature, the reaction solution was concentrated to deposit a powder. The powder was washed with diisopropyl ether to give 27 g of phenacyldi-n-butylsulfonium tetrafluoroborate.

The phenacyldi-n-butylsulfonium tetrafluoroborate in an amount of 10 g was dissolved in 200 ml of methanol, and thereto 10.1 g of potassium nonafluorobutanesulfonate was added and stirred for one hour at room temperature. The reaction solution thus obtained was mixed with 500 ml of chloroform, and washed with two 300 ml portions of distilled water. The organic layer was concentrated to yield 9.8 g of an acid generator (1-1).

The other compounds were synthesized in similar manners to the above.

2. EXAMPLES

Example 1

(1) Preparation and Coating of Negative Resist Solution:

| Resin (29) (Component (A)) | 0.70 g |
| Cross-linking agent MM-1 (Component (B)) | 0.25 g |
| Acid generator I-1 (Component (C)) | 0.05 g |

The above ingredients were dissolved in 8.5 g of propylene glycol monomethyl ether acetate, and therein 0.002 g of OE-1 as Component (D) was mixed and dissolved. Further therein, 0.001 g of Megafac F176 (a product of Dainippon Ink & Chemicals, Inc., hereinafter abbreviated as "W-1") as a surfactant was mixed and dissolved. The solution obtained was subjected to fine filtration with a membrane filter 0.1 μm in pore diameter, thereby preparing a negative resist solution.

The thus prepared negative resist solution was coated on a 6-inch wafer by means of a spin coater Mark 8 made by Tokyo Electron, and dried for 90 seconds on a 110° C. hot plate to form a resist film having a thickness of 0.3 μm.

(2) Formation of Negative Resist Patterns:

The resist film is irradiated with an electron-beam drawing apparatus (acceleration voltage: 50 KeV, Model HL750 made by Hitachi Ltd.). The irradiated resist film was heated for 90 seconds on a 110° C. hot plate, dipped in a 2.38 weight % tetramethylammonium hydroxide (TMAH) for 60 seconds, rinsed with water for 30 seconds, and then dried. Evaluations of sensitivity, resolution, pattern profile and line edge roughness were performed on the thus formed patterns in accordance with the following methods.

(2-1) Sensitivity

The cross-sectional profiles of the patterns were observed under a scanning electron microscope (Model S-4300 made by Hitachi Ltd.). The amount of exposure (the amount of electron-beam irradiation) required for resolving 0.15 μm patterns at a line/space ratio of 1:1 was defined as the sensitivity.

(2-2) Resolution

The limiting resolution (line and space is isolated and resolved) under the exposure giving the sensitivity defined above was taken as the resolution.

(2-3) Pattern Profile

The cross-sectional profiles of 0.15 μm line patterns formed under the exposure giving the sensitivity defined above were observed under the scanning electron microscope (Model S-4300 made by Hitachi Ltd.). The pattern profiles were rated on a scale of 1 to 3 (namely 1 being taper, 2 rather taper and 3 rectangular).

(2-4) Line Edge Roughness

As any of 0.14 μm line patterns formed under the exposure giving the sensitivity defined above, line width was measured at 30 points chosen freely in the length direction, and the dispersion in the line widths measured was evaluated in terms of 3σ.

The evaluations made in Example 1 gave good results. More specifically, it was found that the sensitivity was 4.5 µC/cm², the resolution was 0.10 µm, the pattern profile was rectangular and the line edge roughness was 7.5 nm.

Examples 2 to 30

Using various combinations of ingredients as shown in Tables 1 to 3, negative resist solutions were prepared and negative patterns were formed in the same manner as in Example 1. The evaluation results are shown in Tables 4 and 5.

Comparative Example 1

The preparation of a negative resist solution and the formation of negative patterns were carried out in the same manners as in Example 1, except that the present acid generator of Component (C) was not used but an acid generator Z-5 alone, which differs from Component (C) in structure, was used. The evaluation results obtained are shown in Table 5.

Comparative Example 2

The preparation of a negative resist solution and the formation of negative patterns were carried out in the same manners as in Example 9, except that the present acid generator of Component (C) was not used but an acid generator Z-12 alone, which differs from Component (C) in structure, was used. The evaluation results obtained are shown in Table 5.

Comparative Example 3

The preparation of a negative resist solution and the formation of negative patterns were carried out in the same manners as in Example 10, except that the present acid generator of Component (C) was not used but an acid generator Z-17 alone, which differs from Component (C) in structure, was used. The evaluation results obtained are shown in Table 5.

TABLE 1

| Example | Resin (A) 0.70 g | Acid generator (C)/other acid generator | Cross-linking agent (B) | Nitrogen containing basic compound (D) | Solvent 8.5 g | Surfactant 0.001 g |
|---|---|---|---|---|---|---|
| 1 | (29) Mw = 9200<br>x/y = 80/20<br>M/Mm = 2.2 | I-1 0.05 g | MM-1<br>0.25 g | OE-1<br>0.002 g | S-1 8.5 g | W-1 |
| 2 | (1) Mw = 11000<br>Mw/Mn = 1.4 | I-2 0.03 g<br>Z-5 0.03 g | MM-1<br>0.25 g | OE-1<br>0.002 g | S-1 7.0 g<br>S-2 1.5 g | W-1 |
| 3 | (27) Mw = 7500<br>x/y = 85/15<br>M/Mn = 1.7 | I-3 0.05 g<br>Z-8 0.01 g | MM-1<br>0.25 g | OE-1<br>0.002 g | S-1 8.5 g | W-1 |
| 4 | (1) Mw = 6000<br>Mw/Mn = 1.5 | I-4 0.02 g<br>Z-14 0.05 g | MM-2<br>0.20 g | OE-2<br>0.002 g | S-1 5.0 g<br>S-2 3.5 g | W-1 |
| 5 | (93) Mw = 9000<br>x/y = 85/15<br>M/Mn = 1.6 | I-10 0.06 g | MM-1<br>0.20 g | OE-3<br>0.002 g | S-1 8.5 g | — |
| 6 | (94) Mw = 12000<br>x/y = 90/10<br>M/Mn = 2.0 | I-16 0.04 g<br>Z-22 0.02 g | MM-3<br>0.25 g | OE-3<br>0.002 g | S-2 8.5 g | W-2 |
| 7 | (96) Mw = 7000<br>x/y = 90/10<br>M/Mn = 2.2 | I-26 0.03 g<br>Z-13 0.03 g | MM-4<br>0.30 g | OE-1<br>0.002 g | S-1 7.0 g<br>S-2 1.5 g | W-2 |
| 8 | (15) Mw = 12800<br>Mw/Mn = 1.8 | I-46 0.07 g | MM-1<br>0.30 g | OE-1<br>0.002 g | S-1 7.0 g<br>S-2 1.5 g | W-1 |
| 9 | (1) Mw = 15000<br>Mw/Mn = 1.4 | I-1 0.05 g<br>Z-12 0.02 g | MM-5<br>0.25 g | OE-2<br>0.002 g | S-1 7.0 g<br>S-2 1.5 g | W-1 |
| 10 | (2) Mw = 9000<br>Mw/Mn = 1.6 | I-37 0.04 g<br>Z-17 0.02 g | CL-2<br>0.25 g | OE-4<br>0.002 g | S-1 7.0 g<br>S-2 1.5 g | W-2 |
| 11 | (25) Mw = 7800<br>x/y = 80/20<br>Mw/Mn = 1.9 | I-49 0.03 g<br>Z-10 0.04 g | CL-1<br>0.25 g | OE-4<br>0.002 g | S-1 8.5 g | W-1 |
| 12 | (31) Mw = 10500<br>x/y = 90/10<br>M/Mn = 1.7 | I-2 0.02 g<br>Z-1 0.05 g | CL-2<br>0.25 g | OE-4<br>0.002 g | S-1 2.0 g<br>S-2 6.5 g | W-1 |
| 13 | (32) Mw = 7500<br>x/y = 95/5<br>M/Mn = 2.0 | I-4 0.07 g<br>Z-5 0.01 g | CL-1<br>0.25 g | OE-1<br>0.002 g | S-1 7.0 g<br>S-2 1.5 g | W-1 |
| 14 | (32) Mw = 4500<br>x/y = 90/10<br>M/Mn = 1.6 | I-3 0.02 g<br>Z-17 0.05 g | CL-1<br>0.25 g | OE-2<br>0.002 g | S-1 7.0 g<br>S-2 1.5 g | W-2 |
| 15 | (36) Mw = 8000<br>x/y = 85/15<br>M/Mn = 1.8 | I-31 0.04 g<br>Z-22 0.04 g | MM-4<br>0.30 g | OE-3<br>0.002 g | S-1 7.0 g<br>S-2 1.5 g | W-2 |

TABLE 2

| Example | Resin (A) 0.70 g | Acid generator (C)/other acid generator | Cross-linking agent (B) | Nitrogen containing basic compound (D) | Solvent 8.5 g | Surfactant 0.001 g |
|---|---|---|---|---|---|---|
| 16 | (28) Mw = 13500 x/y = 90/10 M/Mn = 1.5 | I-16 0.03 g Z-14 0.04 g | MM-4 0.30 g | OE-1 0.002 g | S-1 8.5 g | W-2 |
| 17 | (60) Mw = 9500 x/y/z = 90/5/5 M/Mn = 2.0 | I-18 0.05 g Z-9 0.02 g | MM-1 0.20 g | OE-3 0.005 g | S-1 8.0 g S-2 0.5 g | W-1 |
| 18 | (41) Mw = 6000 x/y = 85/15 M/Mn = 1.35 | I-13 0.05 g Z-5 0.03 g | MM-3 0.25 g | OE-1 0.002 g | S-1 7.0 g S-2 1.5 g | W-1 |
| 19 | (95) Mw = 6500 x/y = 90/10 M/Mn = 1.9 | I-7 0.02 g Z-5 0.05 g | MM-2 0.20 g | OE-2 0.002 g | S-1 7.0 g S-2 1.5 g | W-2 |
| 20 | (97) Mw = 6800 Mw/Mn = 2.2 | I-43 0.04 g Z-33 0.03 g | CL-2 0.25 g | OE-3 0.002 g | S-1 8.5 g | W-2 |
| 21 | (98) Mw = 8000 x/y = 80/20 M/mn = 2.2 | I-77 0.10 g | MM-1 0.25 g | OE-1 0.002 g | S-1 8.0 g S-2 0.5 g | W-1 |
| 22 | (29) Mw = 8000 x/y = 80/20 M/Mn = 2.2 | I-77 0.06 g Z-3 0.03 g | MM-1 0.25 g | OE-1 0.002 g | S-1 7.0 g S-2 1.5 g | W-1 |
| 23 | (1) Mw = 2500 Mw/Mn = 1.15 | I-80 0.10 g Z-5 0.05 g | MM-1 0.25 g | OE-1 0.002 g | S-1 8.5 g | W-1 |
| 24 | (1) Mw = 5000 Mw/Mn = 1.18 | I-81 0.05 g Z-16 0.05 g | MM-2 0.20 g | OE-1 0.002 g | S-1 8.5 g | W-1 |
| 25 | (2) Mw = 5000 Mw/Mn = 1.2 | I-82 0.10 g | MM-4 0.20 g | OE-2 0.002 g | S-1 6.5 g S-2 2.0 g | W-1 |
| 26 | (2) Mw = 3000 Mw/Mn = 1.17 | I-83 0.04 g Z-17 0.02 g | MM-3 0.25 g | OE-2 0.002 g | S-2 8.5 g | W-2 |
| 27 | (25) Mw = 5000 x/y = 85/15 M/Mn = 1.15 | I-84 0.03 g Z-23 0.06 g | MM-1 0.25 g | OE-3 0.002 g | S-1 5.5 g S-2 3.0 g | W-1 |
| 28 | (27) Mw = 3000 x/y = 85/15 M/Mn = 1.2 | I-85 0.05 g Z-34 0.04 g | MM-5 0.25 g | OE-3 0.002 g | S-1 8.5 g | W-1 |
| 29 | (29) Mw = 5500 x/y = 90/10 M/Mn = 1.14 | I-90 0.02 g Z-9 0.05 g | MM-3 0.20 g | OE-1 0.002 g | S-1 8.5 g | W-1 |
| 30 | (93) Mw = 5000 x/y = 85/15 M/Mn = 1.18 | I-78 0.12 g | MM-1 0.20 g | OE-1 0.002 g | S-1 7.0 g S-2 1.5 g | — |

TABLE 3

| Comparative Example | Resin (A) 0.70 g | Acid generator (C)/other acid generator | Cross-linking agent (B) | Nitrogen containing basic compound (D) | Solvent 8.5 g | Surfactant 0.001 g |
|---|---|---|---|---|---|---|
| 1 | (29) Mw = 9200 x/y = 80/20 M/Mn = 2.2 | Z-5 0.07 g | MM-1 0.25 g | OE-1 0.002 g | S-1 8.5 g | W-1 |
| 2 | (1) Mw = 15000 Mw/Mn = 1.4 | Z-12 0.06 g | MM-1 0.25 g | OE-2 0.002 g | S-1 7.0 g S-2 1.5 g | W-1 |
| 3 | (2) Mw = 9000 Mw/Mn = 1.6 | Z-17 0.06 g | CL-2 0.25 g | OE-4 0.002 g | S-1 7.0 g S-2 1.5 g | W-2 |

<Explanations of the Symbols Standing for the Ingredients Set Forth in Tables 1 to 3>

The cross-linking agents CL-1 and CL-2 have the following structures, respectively.

CL-1:

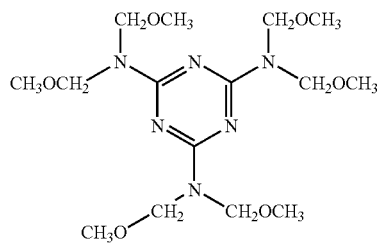

CL-2:

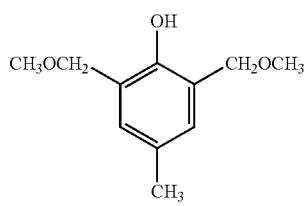

The nitrogen containing basic compounds set forth in Tables 1 to 3 are as follows:
OE-1: 1,5-diazabicyclo[4.3.0]non-5-ene
OE-2: 2,4,5-triphenylimidazole
OE-3: 4-dimethylaminopyridine
OE-4: tri-n-butylamine (All of these compounds are products of TOKYO KASEI KOGYO CO., LTD.)

The solvents set forth in Tables 1 to 3 are as follows:
S-1: propylene glycol monomethyl ether acetate
S-2: propylene glycol monomethyl ether The surfactants set forth in Table 1 to 3 are as follows:
W-1: Megafac F176 (produced by Dainippon Ink & Chemicals Inc.)
W-2: organosiloxane polymer KP341 (produced by Shin-Etsu chemical industry Co., Ltd.)

TABLE 4

| | Sensitivity ($\mu c/cm^2$) | Resolution ($\mu m$) | Pattern profile (evaluation on 1-to-3 scale) | Line edge roughness (nm) |
|---|---|---|---|---|
| Example 1 | 4.5 | 0.10 | rectangular | 7.5 |
| Example 2 | 4.0 | 0.10 | rectangular | 6.5 |
| Example 3 | 4.5 | 0.09 | rectangular | 7.0 |
| Example 4 | 6.0 | 0.09 | rectangular | 8.0 |
| Example 5 | 4.0 | 0.10 | rather taper | 5.0 |
| Example 6 | 5.0 | 0.11 | rectangular | 5.5 |
| Example 7 | 5.5 | 0.10 | rectangular | 6.0 |
| Example 8 | 4.5 | 0.10 | rectangular | 7.0 |
| Example 9 | 4.0 | 0.10 | rather taper | 7.5 |
| Example 10 | 5.0 | 0.09 | rectangular | 7.0 |
| Example 11 | 4.5 | 0.09 | rectangular | 5.5 |
| Example 12 | 4.5 | 0.09 | rectangular | 8.0 |
| Example 13 | 5.0 | 0.10 | rectangular | 5.0 |
| Example 14 | 5.5 | 0.10 | rectangular | 5.5 |
| Example 15 | 4.0 | 0.11 | rectangular | 6.0 |
| Example 16 | 5.0 | 0.10 | rather taper | 6.5 |
| Example 17 | 5.0 | 0.09 | rectangular | 5.0 |
| Example 18 | 4.5 | 0.11 | rectangular | 6.5 |
| Example 19 | 5.0 | 0.10 | rectangular | 7.0 |
| Example 20 | 4.0 | 0.10 | rectangular | 7.5 |

TABLE 5

| | Sensitivity ($\mu C/cm^2$) | Resolution ($\mu m$) | Pattern profile (evaluation on 1-to-3 scale) | Line edge roughness (nm) |
|---|---|---|---|---|
| Example 21 | 3.5 | 0.10 | rectangular | 6.5 |
| Example 22 | 4.5 | 0.09 | rectangular | 4.5 |
| Example 23 | 3.0 | 0.09 | rectangular | 5.5 |
| Example 24 | 4.0 | 0.10 | rectangular | 7.0 |
| Example 25 | 4.5 | 0.11 | rectangular | 6.5 |
| Example 26 | 5.5 | 0.10 | rectangular | 5.0 |
| Example 27 | 4.5 | 0.09 | rather taper | 6.0 |
| Example 28 | 4.5 | 0.09 | rectangular | 5.5 |
| Example 29 | 5.0 | 0.09 | rectangular | 6.5 |
| Example 30 | 3.5 | 0.10 | rectangular | 6.0 |
| Comparative Example 1 | 5.0 | 0.13 | taper | 20.5 |
| Comparative Example 2 | 5.5 | 0.13 | rather taper | 18.5 |
| Comparative Example 3 | 6.5 | 0.12 | rather taper | 16.0 |

As can be seen from Tables 4 and 5, the negative resist compositions relating to the invention had excellent performance capabilities and ensured high sensitivity, high resolution, good pattern profiles and slight line-edge roughness.

In forming patterns by irradiation with electron beams or X-rays, negative resist compositions according to the invention can ensure high sensitivity, high resolution, good pattern profiles and slight line-edge roughness.

The entire disclosure of each and every foreign patent application from which the benefit of foreign priority has been claimed in the present application is incorporated herein by reference, as if fully set forth.

What is claimed is:
1. A negative resist composition comprising:
(A) an alkali-soluble polymer;
(B) a cross-linking agent that forms a cross-link between the alkali-soluble polymers (A) by the action of an acid;
(C) an acid generator that is represented by the following formula (I) and is capable of generating an acid upon irradiation with one of an actinic ray and a radiation; and
(D) a nitrogen-containing basic compound:

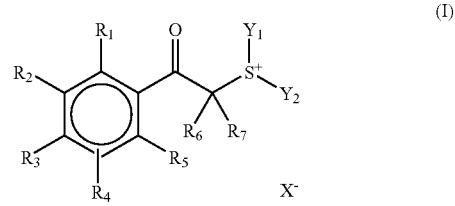

wherein $R_1$ to $R_5$, which are the same or different, each represents a hydrogen atom, a nitro group, a halogen atom, an alkyl group, an alkoxy group, an alkyloxycarbonyl group, an aryl group or an acylamino group; at least two of $R_1$ to $R_5$ may be combined with each other to form a cyclic structure; $R_6$ and $R_7$, which are the same or different, each represents a hydrogen atom, a cyano group, an alkyl group or an aryl group; $Y_1$ and $Y_2$, which are the same or different, each represents an alkyl group or an alkenyl group, with proviso that, when both $Y_1$ and $Y_2$ are alkyl groups, at least one of the alkyl groups represented by $Y_1$ and $Y_2$ has one of a hydroxyl group, an ether linkage group and a sulfide linkage group, or the alkyl groups represented by $Y_1$ and $Y_2$ each contains at least two carbon atoms; $Y_1$ and $Y_2$ may be combined with each other to form a ring together with $S^+$; at least one of $R_1$ to $R_5$ and at least one of $Y_1$ and $Y_2$ may be combined with each other to form a ring; at least one of $R_1$ to $R_5$ and at least one of $R_6$ and $R_7$ may be combined with each other to form a ring; at least two of the compounds represented by formula (I) may combine with each other via a linkage group at the site of any one of $R_1$ to $R_7$, $Y_1$ and $Y_2$ to form a dimer or more; and $X^-$ represents a non-nucleophilic anion, which further comprises an acid generator other than the acid generator (C) represented by formula (I), capable of generating an acid upon irradiation with actinic rays or radiation.

2. The negative resist composition as described in claim 1, wherein the alkali-soluble polymer (A) is a copolymer containing a repeating unit having a mononuclear aromatic structure and a repeating unit having a polynuclear aromatic structure.

3. The negative resist composition as described in claim 1, wherein the alkali-soluble polymer (A) contains a repeating unit represented by the following formula (b):

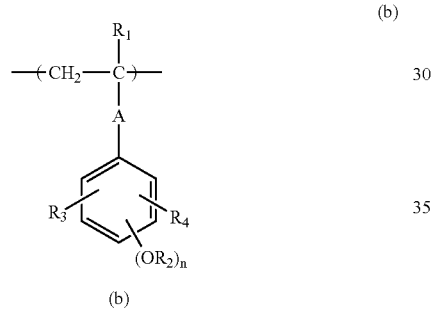

(b)

wherein $R_{11}$ represents a hydrogen atom, a halogen atom, a cyano group or an unsubstituted or substituted alkyl group; $R_{12}$ represents a hydrogen atom, an alkyl, cycloalkyl, aryl, aralkyl or acyl group which are unsubstituted or substituted; $R_{13}$ and $R_{14}$, which are the same or different, each represents a hydrogen atom, a halogen atom, a cyano group, an alkyl, cycloalkyl, alkenyl, aralkyl or aryl group which are unsubstituted or substituted; A represents a single bond, an alkylene, alkenylene, cycloalkylene or arylene group which are unsubstituted or substituted, —O—, —SO$_2$—, —O—CO—R$_5$—, —CO—O—R$_6$—, or —CO—N(R$_7$)—R$_8$—; R$_5$, R$_6$ and R$_8$ each represents a single bond, an alkylene, alkenylene, cycloalkylene or arylene group which are unsubstituted or substituted, or a divalent group formed of: (1) at least one of the above groups; and (2) at least one structure selected from the group consisting of an ether structure, an ester structure, an amide structure, a urethane structure and a ureide structure; R$_7$ represents a hydrogen atom, or an alkyl, cycloalkyl, aralkyl or aryl group which are unsubstituted or substituted; n represents an integer of 1 to 3; and plural R$_{12}$ may be combined together or one R$_{12}$ may be combined with R$_{13}$ or R$_{14}$ to form a ring.

4. The negative resist composition as described in claim 3, wherein the alkali-soluble polymer (A) contains the repeating unit represented by the formula (b) in an amount of 5 to 100% by mole based on the total repeating units in the polymer (A).

5. The negative resist composition as described in claim 1, wherein the alkali-soluble polymer (A) contains at least one of repeating units selected from a repeating unit represented by the following formula (b-2) and a repeating unit represented by the following formula (b-3):

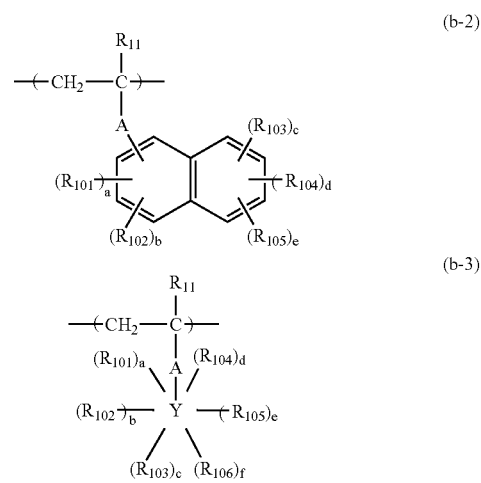

wherein $R_{11}$ represents a hydrogen atom, a halogen atom, a cyano group or an unsubstituted or substituted alkyl group; A represents a single bond, an alkylene, alkenylene, cycloalkylene or arylene group which are unsubstituted or substituted, —O—, —SO$_2$—, —O—CO—R$_{25}$—, —CO—O—R$_{26}$—, or —CO—N(R$_{27}$)—R$_{28}$—; R$_{25}$, R$_{26}$ and R$_{28}$ each represents a single bond, an alkylene, alkenylene, cycloalkylene or arylene group which are unsubstituted or substituted, or a divalent group formed of: (1) at least one of the above groups; and (2) at least one structure selected from the group consisting of an ether structure, an ester structure, an amide structure, a urethane structure and a ureide structure; and R$_{27}$ represents a hydrogen atom, or an alkyl, cycloalkyl, aralkyl or aryl group which are unsubstituted or substituted; R$_{101}$ to R$_{106}$ each independently represents a hydroxyl group, a carboxyl group, an amino group, an alkyl, cycloalkyl, alkoxy, alkylcarbonyloxy, alkylsulfonyloxy, alkenyl, aryl, aralkyl, N-alkylamino or N-dialkylamino group which are unsubstituted or substituted; a to f each independently represents an integer of 0 to 3; and Y represents a condensed polynuclear aromatic structure selected from the structures below:

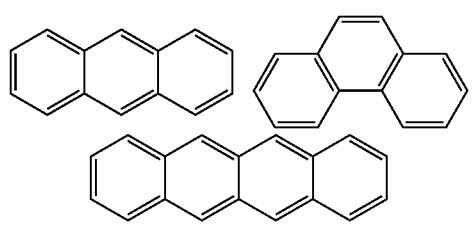

-continued

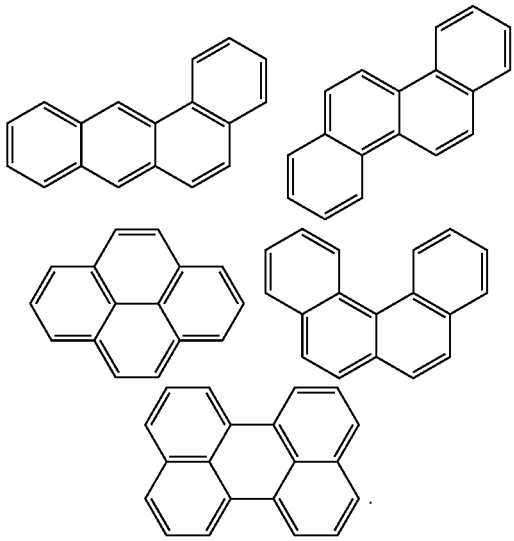

6. The negative resist composition as described in claim 5, wherein the alkali-soluble polymer (A) contains the at least one of repeating units selected from the repeating unit represented by the formula (b-2) and the repeating unit represented by the formula (b-3) in an amount of 3 to 50% by mole based on the total repeating units in the polymer (A).

7. The negative resist composition as described in claim 1, wherein the cross-linking agent (B) comprises at least one selected from the group consisting of: a compound or resin which each contains at least two of a hydroxylmethyl group, an alkoxymethyl group, an acyloxymethyl group and an alkoxymethyl ether group; and an epoxy compound.

8. The negative resist composition as described in claim 1, wherein the cross-linking agent (B) comprises a phenol derivative having: a molecular weight of 1,200 or below; 3 to 5 benzene rings in its molecule; and at least one of a hydroxymethyl group and an alkoxymethyl group in the total number of at least two in its molecule,
wherein the hydroxymethyl and/or alkoxymethyl groups bind to the 3 to 5 benzene rings.

9. The negative resist composition as described in claim 1, wherein in the formula (I), the non-nucleophilic anion as $X^-$ is at least one of a sulfonic acid anion, a carboxylic acid anion, a bis(alkylsulfonyl)imide anion and a tris(alkylsulfonyl)methyl anion.

10. The negative resist composition as described in claim 9, wherein the sulfonic acid anion is at least one of an alkylsulfonic acid anion, an arylsulfonic acid anion and a camphorsulfonic acid anion.

11. The negative resist composition as described in claim 1, wherein in the formula (I), the non-nucleophilic anion as $X^-$ is a sulfonic acid anion containing at least one fluorine atom.

12. The negative resist composition as described in claim 11, wherein in the formula (I), the non-nucleophilic anion as $X^-$ is a sulfonic acid anion that is substituted by a fluorine atom at the 1-position.

13. The negative resist composition as described in claim 11, wherein in the formula (I), the non-nucleophilic anion as $X^-$ is a perfluoroalkanesulfonic acid anion.

14. The negative resist composition as described in claim 11, wherein in the formula (I), the non-nucleophilic anion as $X^-$ is a benzenesulfonic acid anion containing a fluorine atom or a fluorine-containing substituent.

15. A negative resist composition comprising:
(A) an alkali-soluble polymer;
(B) a cross-linking agent that forms a cross-link between the alkali-soluble polymers (A) by the action of an acid;
(C) an acid generator that is represented by the following formula (I) and is capable of generating an acid upon irradiation with one of an actinic ray and a radiation; and
(D) a nitrogen-containing basic compound:

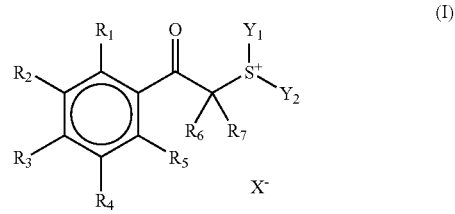

(I)

wherein $R_1$ to $R_5$, which are the same or different, each represents a hydrogen atom, a nitro group, a halogen atom, an alkyl group, an alkoxy group, an alkyloxycarbonyl group, an aryl group or an acylamino group; at least two of $R_1$ to $R_5$ may be combined with each other to form a cyclic structure; $R_6$ and $R_7$, which are the same or different, each represents a hydrogen atom, a cyano group, an alkyl group or an aryl group; $Y_1$ and $Y_2$, which are the same or different, each represents an alkyl group or an alkenyl group, with proviso that, when both $Y_1$ and $Y_2$ are alkyl groups, at least one of the alkyl groups represented by $Y_1$ and $Y_2$ has one of a hydroxyl group, an ether linkage group and a sulfide linkage group, or the alkyl groups represented by $Y_1$ and $Y_2$ each contains at least two carbon atoms; $Y_1$ and $Y_2$ may be combined with each other to form a ring together with $S^+$; at least one of $R_1$ to $R_5$ and at least one of $Y_1$ and $Y_2$ may be combined with each other to form a ring; at least one of $R_1$ to $R_5$ and at least one of $R_6$ and $R_7$ may be combined with each other to form a ring; at least two of the compounds represented by formula (I) may combine with each other via a linkage group at the site of any one of $R_1$ to $R_7$, $Y_1$ and $Y_2$ to form a dimer or more; and $X^-$ represents a non-nucleophilic anion, wherein the alkali-soluble polymer (A) is a copolymer containing a repeating unit having a mononuclear aromatic structure and a repeating unit having a polynuclear aromatic structure.

16. A negative resist composition comprising:
(A) an alkali-soluble polymer;
(B) a cross-linking agent that forms a cross-link between the alkali-soluble polymers (A) by the action of an acid;
(C) an acid generator that is represented by the following formula (I) and is capable of generating an acid upon irradiation with one of an actinic ray and a radiation; and
(D) a nitrogen-containing basic compound:

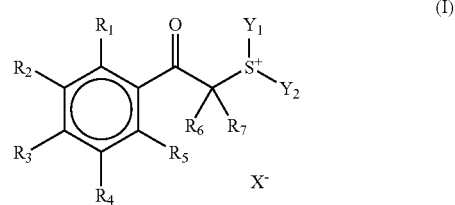

(I)

wherein $R_1$ to $R_5$, which are the same or different, each represents a hydrogen atom, a nitro group, a halogen atom, an alkyl group, an alkoxy group, an alkyloxycarbonyl group, an aryl group or an acylamino group; at least two of $R_1$ to $R_5$ may be combined with each other to form a cyclic structure; $R_6$ and $R_7$, which are the same or different, each represents a hydrogen atom, a cyano group, an alkyl group or an aryl group; $Y_1$ and $Y_2$, which are the same or different, each represents an alkyl group or an alkenyl group, with proviso that, when both $Y_1$ and $Y_2$ are alkyl groups, at least one of the alkyl groups represented by $Y_1$ and $Y_2$ has one of a hydroxyl group, an ether linkage group and a sulfide linkage group, or the alkyl groups represented by $Y_1$ and $Y_2$ each contains at least two carbon atoms; $Y_1$ and $Y_2$ may be combined with each other to form a ring together with $S^+$; at least one of $R_1$ to $R_5$ and at least one of $Y_1$ and $Y_2$ may be combined with each other to form a ring; at least one of $R_1$ to $R_5$ and at least one of $R_6$ and $R_7$ may be combined with each other to form a ring; at least two of the compounds represented by formula (I) may combine with each other via a linkage group at the site of any one of $R_1$ to $R_7$, $Y_1$ and $Y_2$ to form a dimer or more; and X represents a non-nucleophilic anion, wherein the alkali-soluble polymer (A) contains at least one of repeating units selected from a repeating unit represented by the following formula (b-2) and a repeating unit represented by the following formula (b-3):

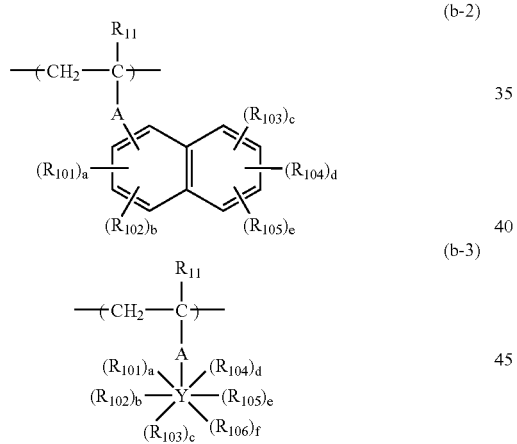

(b-2)

(b-3)

wherein $R_{11}$ represents a hydrogen atom, a halogen atom, a cyano group or an unsubstituted or substituted alkyl group; A represents a single bond, an alkylene, alkenylene, cycloalkylene or arylene group which are unsubstituted or substituted, —O—, —SO$_2$—, —O—CO—R$_{25}$—, —CO—O—R$_{26}$—, or CO—N(R$_{27}$)—R$_{28}$—; $R_{25}$, $R_{26}$ and $R_{28}$ each represents a single bond, an alkylene, alkenylene, cycloalkylene or arylene group which are unsubstituted or substituted, or a divalent group formed of: (1) at least one of the above groups; and (2) at least one structure selected from the group consisting of an ether structure, an ester structure, an amide structure, a urethane structure and a ureide structure; and $R_{27}$ represents a hydrogen atom, or an alkyl, cycloalkyl, aralkyl or aryl group which are unsubstituted or substituted; $R_{101}$ to $R_{106}$ each independently represents a hydroxyl group, a carboxyl group, an amino group, an alkyl, cycloalkyl, alkoxy, alkylcarbonyloxy, alkylsulfonyloxy, alkenyl, aryl, aralkyl, N-alkylamino or N-dialkylamino group which are unsubstituted or substituted; a to f each independently represents an integer of 0 to 3; and Y represents a condensed polynuclear aromatic structure selected from the structures below:

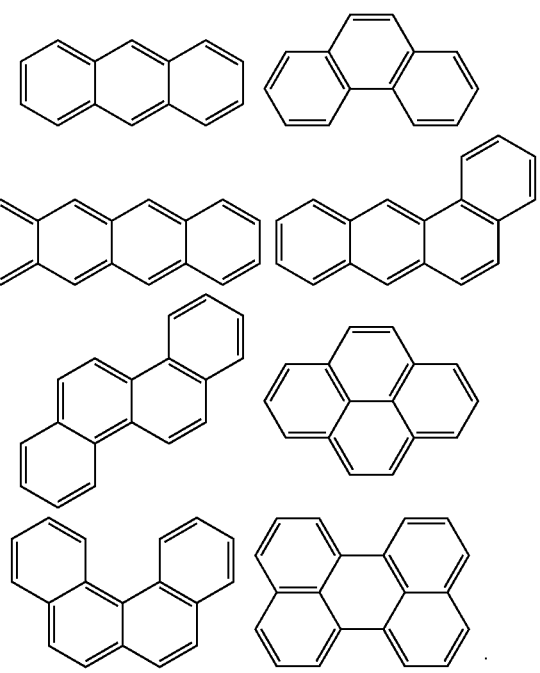

* * * * *